(12) United States Patent
Mimura et al.

(10) Patent No.: US 8,574,809 B2
(45) Date of Patent: Nov. 5, 2013

(54) POSITIVE RESIST COMPOSITION AND METHOD OF FORMING RESIST PATTERN

(75) Inventors: Takeyoshi Mimura, Kawasaki (JP); Jun Iwashita, Kawasaki (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 503 days.

(21) Appl. No.: 12/461,862

(22) Filed: Aug. 26, 2009

(65) Prior Publication Data

US 2010/0055606 A1 Mar. 4, 2010

(30) Foreign Application Priority Data

Aug. 27, 2008 (JP) .............................. P2008-218288
Feb. 20, 2009 (JP) .............................. P2009-038433
Aug. 10, 2009 (JP) .............................. P2009-185819

(51) Int. Cl.
*G03F 7/039* (2006.01)
*G03F 7/20* (2006.01)
*G03F 7/30* (2006.01)

(52) U.S. Cl.
USPC ......... 430/270.1; 430/905; 430/311; 430/326

(58) Field of Classification Search
None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 2004/0110085 A1 | 6/2004 | Iwai et al. | |
| 2005/0282083 A1* | 12/2005 | Funatsu et al. | 430/270.1 |
| 2006/0014913 A1* | 1/2006 | Lee et al. | 526/266 |
| 2006/0068324 A1 | 3/2006 | Mita | 430/270.1 |
| 2006/0166138 A1 | 7/2006 | Shimizu et al. | 430/270.1 |
| 2007/0224538 A1 | 9/2007 | Hada et al. | 430/270.1 |
| 2009/0209726 A1* | 8/2009 | Matsumoto et al. | 528/354 |

FOREIGN PATENT DOCUMENTS

| | | |
|---|---|---|
| JP | 9-208554 | 8/1997 |
| JP | 11-035551 | 2/1999 |
| JP | 11-035552 | 2/1999 |
| JP | 11-035573 | 2/1999 |
| JP | 11-322707 | 11/1999 |
| JP | 2003-084436 | 3/2003 |
| JP | 2003-241385 | 8/2003 |
| JP | 2006-018229 | 1/2006 |
| JP | 2006-091762 | 4/2006 |
| JP | 2006-227532 * | 8/2006 |
| JP | 2007-206091 | 8/2007 |
| JP | 2008-65266 * | 3/2008 |
| JP | 2008-250157 * | 10/2008 |
| WO | 2004/074242 | 9/2004 |
| WO | WO 2005/116098 A1 * | 12/2005 |
| WO | WO 2006/016648 A1 * | 2/2006 |

OTHER PUBLICATIONS

Derwent English abstract for JP2008-65266 (2008).*
Machine-assisted English translation provided by JPO (2008).*
Derwent English abstract for WO 2006/016648 A1 (2006).*
Derwent English abstract for JP 2006-227532 (2006).*
Machine-assisted English translation for JP 2006-227532, provided by JPO (2006).*
Derwent English abstract for JP 2008-250157 (2008).*
Machine-assisted English translation for JP 2008-250157, provided by JPO (2008).*
Office Action issued Sep. 3, 2013 in Japanese Application No. 2009-185819.

* cited by examiner

*Primary Examiner* — Sin J. Lee
(74) *Attorney, Agent, or Firm* — Wenderoth, Lind & Ponack, L.L.P.

(57) ABSTRACT

The present invention provides a positive resist composition capable of forming a resist pattern with high resolution, and a method of forming a resist pattern.
This composition is a positive resist composition including a resin component (A) which exhibits increased solubility in an alkali developing solution under action of acid, and an acid-generator component (B) which generates acid upon irradiation, the resin component (A) containing a polymer including: a core portion represented by general formula (1)

[Chemical Formula 1]

$$P\text{-}(X\text{-}Y)_a \qquad (1)$$

wherein P represents an a-valent organic group; a represents an integer of 2 to 20; Y represents an arylene group or an alkylene group of 1 to 12 carbon atoms; and X represents a specific linking group which can be cleaved under action of acid, and arm portions that are bonded to the core portion and are also composed of a polymer chain obtained by an anionic polymerization method.

12 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition, and a method of forming a resist pattern.

Priority is claimed on Japanese Patent Application No. 2008-218288, filed Aug. 27, 2008 and Japanese Patent Application No. 2009-038433, filed Feb. 20, 2009 and Japanese Patent Application No. 2009-185819, filed Aug. 10, 2009, the contents of which are incorporated herein by reference 2. Description of the Related Art In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under action of acid and an acid generator that generates acid upon exposure. For example, a chemically amplified positive resist contains, as a base resin, a resin which exhibits increased solubility in an alkali developing solution under action of acid, and an acid generator. In the formation of a resist pattern, when acid is generated from the acid generator upon exposure, the exposed portions become soluble in developing solution.

Until recently, polyhydroxystyrene (PHS) or derivative resins thereof in which the hydroxyl groups are protected with acid-dissociable, dissolution-inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now mainly used as base resins for resists that use ArF excimer laser lithography, as they exhibit excellent transparency in the vicinity of 193 nm (for example, see Japanese Unexamined Patent Application, First Publication No. 2003-241385)

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

These base resins of chemically-amplified photoresists can be obtained by radical polymerization of a plurality of (meth)acrylate ester monomers.

However, the molecular weight distribution (ratio of weight average molecular weight (Mw) to a number average molecular weight (Mn):Mw/Mn] of the base resin obtained by the radical polymerization method exceeds 1.5, which can cause problems such as an inability to adequately control the molecular weight and a low yield.

On the other hand, a chemically-amplified photoresist using a base resin having molecular weight distribution of 1.01 to 1.50 has been proposed (for example, see Japanese Unexamined Patent Application, First Publication No. No. 2003-84436).

However, in recent years, as requirements for miniaturization of resist patterns, further improvement in resolution has been demanded in resist patterns formed by a conventional chemically-amplified photoresist positive composition.

It is an objective to form patterns of minute dimensions of several tens of nanometers in lithography techniques that use electron beams or EUV, and thus it becomes an important issue that resist patterns with high resolution can be formed as the resist patterns have more minute dimensions.

SUMMARY OF THE INVENTION

The present invention takes the above circumstances into consideration, with an object of providing a positive resist composition capable of forming a resist pattern with high resolution, and a method of forming a resist pattern.

For solving the above-mentioned problems, the present inventors propose the following aspects.

Specifically, a first aspect of the present invention is a positive resist composition including a resin component (A) which exhibits increased solubility in an alkali developing solution under action of acid, and an acid-generator component (B) which generates acid upon irradiation, the resin component (A) containing a polymer including: a core portion represented by general formula (1) shown below, and arm portions that are bonded to the core portion and are also composed of a polymer chain obtained by an anionic polymerization method:

[Chemical Formula 1]

$$P\text{-}(X\text{---}Y)_a \quad (1)$$

wherein P represents an a-valent organic group; a represents an integer of 2 to 20; Y represents an arylene group or an alkylene group of 1 to 12 carbon atoms; and X represents any one of the linking groups represented by general formulas (2) to (5) which can be cleaved under action of acid;

[Chemical Formula 2]

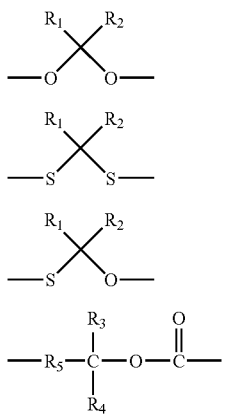

wherein, $R_1$, $R_2$, $R_3$ and $R_4$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, alkoxy group, hydroxyl group or a hydrogen atom; and $R_5$ represents a linear, branched or cyclic alkylene group of 1 to 12 carbon atoms which may be substituted with alkoxy group, hydroxyl group, a halogen atom or an epoxy group, an arylene group which may be substituted with alkoxy group, hydroxyl group, a halogen atom or an epoxy group, or a single bond.

Further, a second aspect of the present invention is a method of forming a resist pattern, including: forming a resist film on a substrate using a positive resist composition of the above-mentioned first aspect of the present invention; conducting exposure of the resist film; and alkali-developing the resist film to form a resist pattern.

In the present description and claims, the term "alkyl group" includes a linear, branched and cyclic monovalent saturated hydrocarbon group, unless otherwise specified.

The term "alkylene group" includes a linear, branched and cyclic divalent saturated hydrocarbon group, unless otherwise specified.

The term "lower alkyl group" refers to an alkyl group of 1 to 5 carbon atoms.

The term "halogenated alkyl group" is a group in which some or all of the hydrogen atoms of an alkyl group have been substituted with halogen atoms, and examples of the halogen atom include a fluorine atom, a chlorine atom, a bromine atom, and an iodine atom.

The term "aliphatic" is a relative concept used in relation to the term "aromatic", and defines a group or compound that has no aromaticity The term "arylene group" means a divalent aromatic group in which two hydrogen atoms have been removed from the nucleus of an aromatic hydrocarbon.

The term "structural unit" means a monomer unit constituting a polymer (polymer compound).

The term "exposure" is used as a general concept that includes not only irradiation with light, but also irradiation with any form of radiation, such as irradiation with an electron beam.

According to the present invention, a positive resist composition capable of forming a resist pattern with high resolution, and a method of forming a resist pattern are provided.

DETAILED DESCRIPTION OF THE INVENTION

<Positive Resist Composition>

The positive resist composition of the present invention includes a resin component (A) which exhibits increased solubility in an alkali developing solution under action of acid (hereinafter referred to as "component (A)") and an acid-generator component (B) which generates acid upon exposure (hereinafter referred to as "component (B)").

In the positive resist composition of the present invention, the component (A) is insoluble in an alkali developing solution prior to exposure. When acid is generated from the component (B) upon exposure, the entire component (A) exhibits increased solubility in an alkali developing solution under action of acid and the component (A) becomes alkali soluble from alkali insoluble. Therefore, in the formation of a resist pattern, by conducting selective exposure of a resist film formed by using the positive resist composition, the exposed portions become alkali-soluble, whereas the unexposed portions remain alkali-insoluble, and thus a resist pattern can be formed by alkali developing.

<Component (A)>

In the present invention, the component (A) contains a polymer including a core portion represented by general formula (1) shown above, and arm portions that are bonded to the core portion and are also composed of a polymer chain obtained by an anionic polymerization method (hereinafter referred to as "polymer (A1)").

(Core Portion)

The core portion of the polymer (A1) is represented by general formula (1).

In general formula (1) above, a represents an integer of 2 to 20, and a is preferably an integer of 2 to 15, and more preferably an integer of 3 to 10. When a is in the above range, resolution is improved and pattern shape is excellent.

P represents an a-valent organic group. When P is divalent (a=2), the core portion of the polymer (A1) has a structure in which two groups "—X—Y(s)" are bonded to P. When P is trivalent (a=3), the core portion has a structure in which three groups "—X—Y(s)" are bonded to P. As the valence a of P increases, the number of groups "—X—Y(s)" bonded to P increases and thus the polymer (A1) has a more dense radial structure.

The organic group of P preferably has 1 to 20 carbon atoms, more preferably 2 to 15 carbon atoms, and particularly preferably 3 to 12 carbon atoms.

As the organic group, an aliphatic hydrocarbon group and an aromatic hydrocarbon group are exemplified.

The aliphatic hydrocarbon group may be either chain-like or cyclic or a combination thereof, or may be either saturated or unsaturated.

The aromatic hydrocarbon group includes, for example, a hydrocarbon group containing an aromatic hydrocarbon ring and, for example, may be composed of an aromatic hydrocarbon ring, or a combination of an aromatic hydrocarbon ring and an aliphatic hydrocarbon group.

The organic group may contain, in the group, a linking group such as an ether group, a polyether group, an ester group [—C(=O)—O—], a carbonyl group [—C(=O)—]; —NH—, —N=, —NH—C(=O)— or —NR$^{25}$— (R$^{25}$ is an alkyl group) and a silicon atom.

As the alkyl group for R$^{25}$, a lower alkyl group of 1 to 5 carbon atoms is exemplified.

Some or all of the hydrogen atoms of the organic group may be substituted with alkyl groups, alkoxy groups, halogen atoms or hydroxyl groups.

The alkyl group with which hydrogen atoms of the organic group may be substituted is preferably an alkyl group of 1 to 5 carbon atoms, and more preferably a methyl group, an ethyl group, a propyl group, an n-butyl group or a tert-butyl group.

The alkoxy group with which hydrogen atoms of the organic group may be substituted is preferably an alkoxy group of 1 to 5 carbon atoms, more preferably a methoxy group, an ethoxy group, an n-propoxy group, an iso-propoxy group, an n-butoxy group or a tert-butoxy group, and particularly preferably a methoxy group or an ethoxy group.

As the halogen atom with which hydrogen atoms of the organic group may be substituted, a fluorine atom, a chlorine atom, a bromine atom and an iodine atom are exemplified, and a fluorine atom is preferable.

Specific examples of the organic group for P include groups represented by the formulas shown below.

[Chemical Formula 3]

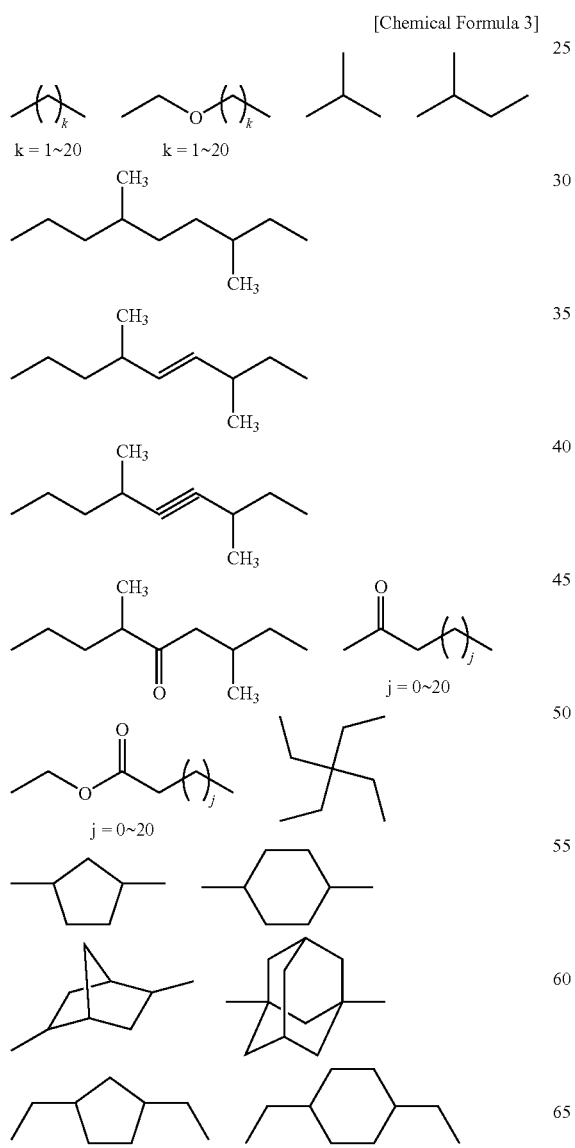

[Chemical Formula 4]

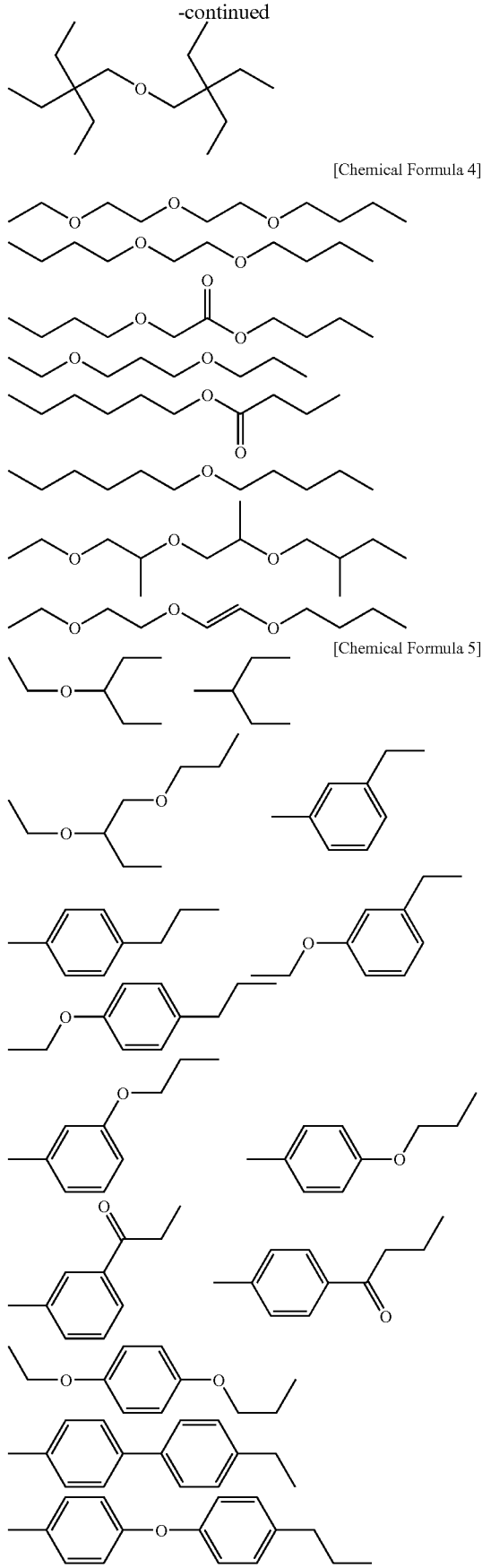

[Chemical Formula 5]

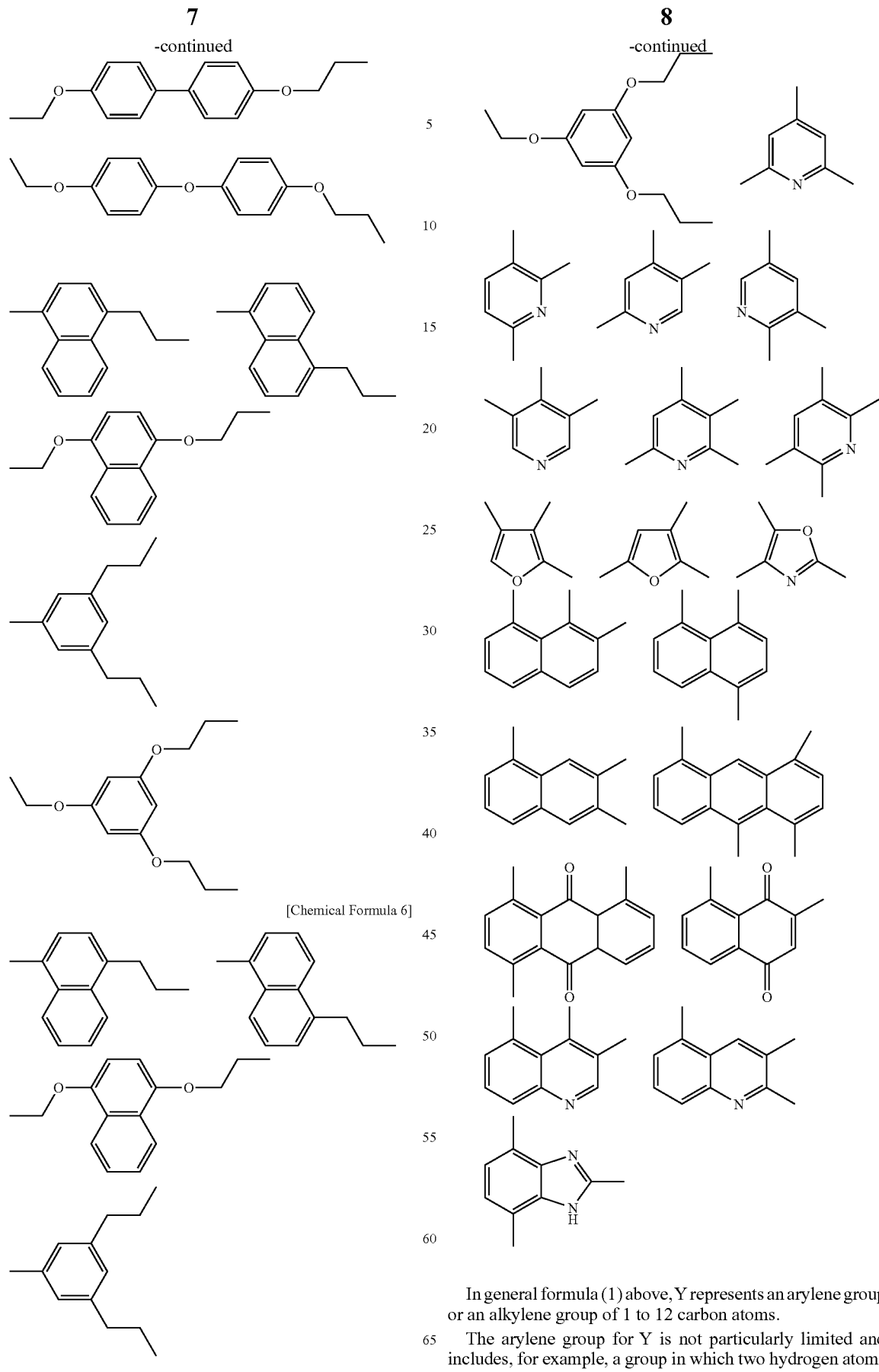
[Chemical Formula 6]
In general formula (1) above, Y represents an arylene group or an alkylene group of 1 to 12 carbon atoms.
The arylene group for Y is not particularly limited and includes, for example, a group in which two hydrogen atoms have been removed from an aromatic hydrocarbon ring of 6 to 20 carbon atoms. In terms of synthesizing at low cost, a group in which two hydrogen atoms have been removed from an aromatic hydrocarbon ring of 6 to 10 carbon atoms is preferable.

Specific examples of the arylene group include groups in which two hydrogen atoms have been removed from benzene, biphenyl, fluorene, naphthalene, anthracene, phenanthrene or pyrene, and a group in which two hydrogen atoms have been removed from benzene or naphthalene is particularly preferable.

Some or all of the hydrogen atoms in the aromatic hydrocarbon ring of the arylene group may be either saturated or unsaturated with substituents such as an alkyl group, an alkoxy group, a halogen atom, a halogenated alkyl group and a hydroxyl group (a group or atom other than a hydrogen atom).

The alkyl group with which the hydrogen atoms of the arylene group may be substituted is preferably an alkyl group of 1 to 5 carbon atoms, and particularly preferably a methyl group, an ethyl group, a propyl group, an n-butyl group or a tert-butyl group.

The alkoxy group with which the hydrogen atoms of the arylene group may be substituted is preferably an alkoxy group of 1 to 5 carbon atoms, more preferably a methoxy group, an ethoxy group, an n-propoxy group, an iso-propoxy group, an n-butoxy group, a tert-butoxy group, and particularly preferably a methoxy group or an ethoxy group.

The halogen atom with which the hydrogen atoms of the arylene group may be substituted is preferably a fluorine atom.

As the halogenated alkyl group with which the hydrogen atoms of the arylene group may be substituted, a group in which some or all of the hydrogen atoms of the alkyl group listed as the substituent of the arylene group is exemplified. Examples of the halogen atom in the halogenated alkyl group include the same halogen atoms as those listed as the substituents of the arylene group.

The halogenated alkyl group is particularly preferably a fluorinated alkyl group.

The alkylene group for Y is preferably linear or branched. The alkylene group has 1 to 12 carbon atoms, preferably 1 to 10 carbon atoms, still more preferably 1 to 5 carbon atoms, particularly preferably 1 (methylene group), and all of ay(s) are most preferably methylene group.

Some or all of the hydrogen atoms of the alkylene group may be either substituted or unsubstituted with substituents (group or atom other than hydrogen atom). Examples of the substituents with which the hydrogen atoms of the alkylene group may be substituted include an alkyl group of 1 to 4 carbon atoms, an alkoxy group of 1 to 4 carbon atoms, hydroxyl group and the like.

Among these, Y is preferably an alkylene group of 1 to 12 carbon atoms, particularly preferably a linear alkylene group, and most preferably 1 (methylene group) or 2 (ethylene group).

In general formula (1) above, X represents any one of liking groups represented by general formulas (2) to (5) shown below which are cleavable under action of acid.

In the present description and claims, the term "cleavable under action of acid" means that a bond of a main chain of the polymer (A1) can be cleaved at the core portion under action of acid generated from the component (B) upon exposure.

[Chemical Formula 7]

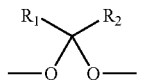

(2)

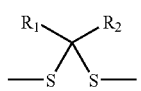

(3)

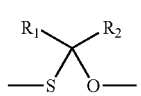

(4)

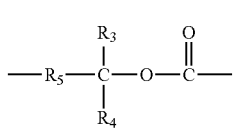

(5)

In general formulas (2) to (5) above, $R_1$, $R_2$, $R_3$ and $R_4$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, alkoxy group, hydroxyl group or a hydrogen atom.

Examples of the halogen atom include a fluorine atom, a chlorine atom, a bromine atom and an iodine atom, and a fluorine atom is particularly preferable.

The alkyl group has 1 to 12 carbon atom and is preferably linear or branched, and more preferably an ethyl group or a methyl group.

The aryl group preferably has 6 to 20 carbon atoms and, for example, a phenyl group and a naphthyl group are exemplified.

The alkoxy group preferably has 1 to 5 carbon atom and is more preferably methoxy group, ethoxy group, n-propoxy group, iso-propoxy group, n-butoxy group or tert-butoxy group.

Among these, $R_1$ and $R_2$ are preferably hydrogen atoms.

$R_3$ and $R_4$ are preferably both alkyl groups, alkoxy group and alkyl group, or alkoxy group and a hydrogen atom.

In general formula (5) above, $R_5$ represents a linear, branched or cyclic alkylene group of 1 to 12 carbon atoms which may be substituted with alkoxy group, hydroxyl group, a halogen atom or an epoxy group, an arylene group which may be substituted with alkoxy group, hydroxyl group, a halogen atom or an epoxy group, or single bond.

As the alkoxy group for $R_5$, the same as the alkoxy group for $R_1$ to $R_4$ can be exemplified.

As the halogen atom for $R_5$, the same as the halogen atoms for $R_1$ to $R_4$ can be exemplified.

As the alkylene group or arylene group for $R_5$, a group in which one hydrogen atom has been removed from the alkyl group or aryl group for $R_1$ to $R_4$ can be exemplified.

Especially, $R_5$ is preferably alkylene group or single bond.

Among linking groups represented by general formulas (2) to (5) shown above, a linking group represented by general formula (2) above and a linking group represented by general formula (4) above are preferable in terms of preferable effects of the present invention, and a linking group represented by general formula (2) above is most preferable.

Specific examples of suitable core portions of the polymer (A1) are shown below.

[Chemical Formula 8]

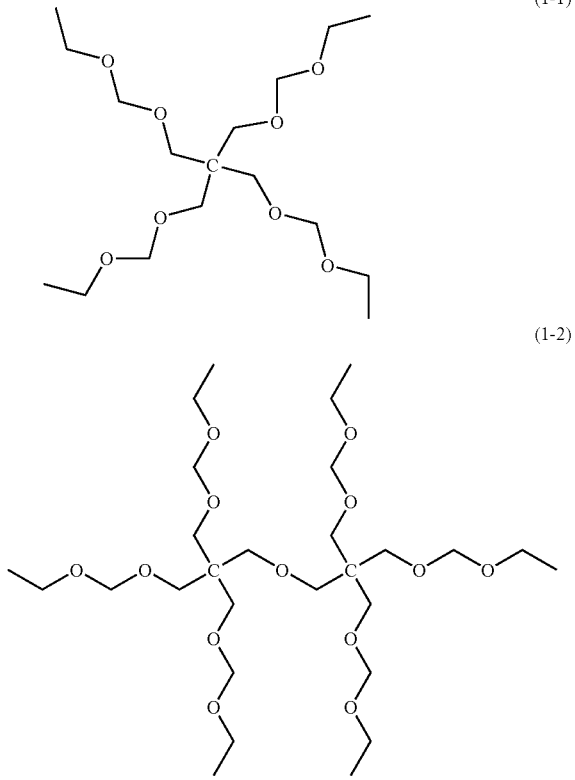

(Arm Portions)

The arm portions of the polymer (A1) are bonded to the core portion and are also composed of a polymer chain obtained by an anionic polymerization method.

The polymer chain to be bonded to the core portion is preferably bonded to each terminal (a terminal of Y in formula (1) above opposite a terminal of X) of the core portion.

The polymer chains to be bonded to the core portion may be the same or different at the core portion, and the polymer chains are preferably the same with each other since effects of the present invention are particularly preferable.

The polymer chain constituting the arm portions preferably has a structural unit derived from a hydroxystyrene derivative (hereinafter referred to as a structural unit (a1)).

The polymer chain constituting the arm portions preferably has a structural unit containing an acid dissociable, dissolution inhibiting group (hereinafter referred to as a structural unit (a2)).

Structural Unit (a1)

A structural unit (a1) is a structural unit derived from a hydroxystyrene derivative.

In the present description and claims, the term "hydroxystyrene derivative" is used as a general concept that includes the hydrogen atoms at the α-position of hydroxystyrene and hydroxystyrene substituted with another substituent such as an alkyl group and a halogenated alkyl group, and derivatives thereof.

The term "α-position (carbon atom on the α-position)" refers to the carbon atom to which the benzene ring is bonded, unless otherwise specified.

The term "structural unit derived from a hydroxystyrene derivative" means a structural unit which is formed by the cleavage of the ethylenic double bond of a hydroxystyrene derivative.

Suitable structural units (a1) include, for example, a structural unit represented by general formula (a1-1) shown below:

[Chemical Formula 9]

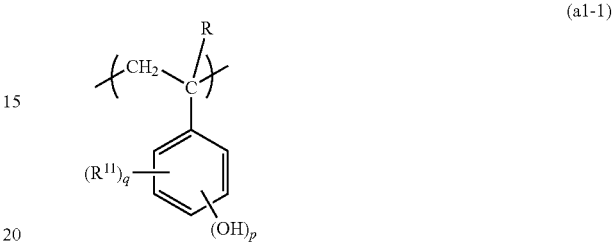

wherein R represents a hydrogen atom, a lower alkyl group of 1 to 5 carbon atoms or a halogenated lower alkyl group of 1 to 5 carbon atoms; $R^{11}$ represents a lower alkyl group of 1 to 5 carbon atoms or a halogen atom; p represents an integer of 1 to 3; and q represents an integer of 0 to 4, with the proviso that $1 \leq p+q \leq 5$.

In general formula (a1-1) above, the lower alkyl group for R is an alkyl group of 1 to 5 carbon atoms, and specific examples thereof include linear or branched alkyl groups such as a methyl group, an ethyl group, a propyl group, an isopropyl group, an n-butyl group, an isobutyl group, a tert-butyl group, a pentyl group, an isopentyl group, and an neopentyl group. Among these, a methyl group is preferable.

A halogenated lower alkyl group for R is a group in which some or all of the hydrogen atoms of the lower alkyl group have been substituted with halogen atoms (a fluorine atom, a chlorine atom, a bromine atom, an iodine atom, etc.). Among these, a fluorinated lower alkyl group is preferable, and a group in which all of the hydrogen atoms is substituted with fluorine atoms is more preferable. Specific examples of the fluorinated lower alkyl group include a trifluoromethyl group, a hexafluoroethyl group, a heptafluoropropyl group, and a nonafluorobutyl group.

R is preferably a hydrogen atom or a lower alkyl group, and particularly preferably a hydrogen atom or a methyl group.

P is an integer of 1 to 3, and preferably 1.

The hydroxyl group may be bonded at any one of the o-position, m-position and p-position of the phenyl group.

When p is 1, the p-position is preferable in terms of availability and low coat.

When p is 2 or 3, any substitution position can be combined.

Q is an integer of 0 to 4, preferably 0 or 1, and particularly preferably 0 from an industrial point of view.

As the lower alkyl group for $R^{11}$, the same as the lower alkyl group for R can be exemplified.

As the halogen atom for $R^{11}$, a fluorine atom, a chlorine atom, a bromine atom and an iodine atom are exemplified, and a fluorine atom is preferable.

When q is 1, $R^{11}$ may be substituted at any one of the o-position, m-position and p-position.

When q is 2, any substitution position can be combined, with the proviso that $1 \leq p+q \leq 5$.

As the structural unit (a1), one type may be used alone, or two or more types may be used in combination.

The amount of the structural unit (a1) is preferably from 50 to 90 mol %, more preferably from 55 to 90 mol %, and still more preferably from 60 to 88 mol %, based on the combined total of all structural units constituting the polymer chain as the arm portion. By making the amount of the structural unit (a1) at least as large as the lower limit of the above-mentioned range, proper alkali solubility is obtained. On the other hand, by making the amount of the structural unit (a1) no more than the upper limit of the above-mentioned range, a good balance can be achieved with the other structural units.

Structural Unit (a2)

A structural unit (a2) is a structural unit containing an acid dissociable, dissolution inhibiting group.

In the present description and claims, the term "acid dissociability" means that it is dissociable from a polymer chain constituting the arm portions of the polymer (A1) under action of acid generated from the component (B) upon exposure.

The term "dissolution inhibiting group" means a group which has an alkali dissolution-inhibiting property that renders the entire component (A1) insoluble or slightly soluble in an alkali prior to dissociation, and renders the entire component (A1) soluble in the alkali after dissociation.

As the acid-dissociable, dissolution-inhibiting group in the structural unit (a2), any of the groups that have been proposed as acid-dissociable, dissolution-inhibiting groups for the base resins of chemically amplified resists can be used, provided the group has an alkali dissolution-inhibiting effect that renders the entire polymer (A1) insoluble or slightly soluble in an alkali developing solution prior to dissociation, and then following dissociation by action of acid, increases the solubility of the entire polymer (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, the term "tertiary alkyl ester" describes a structure in which an ester is formed by substituting the hydrogen atom of a carboxyl group in (meth)acrylic acid with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description, the term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a2) has 3 to 20 carbon atoms and may or may not have a substituent. Examples of substituents include lower alkyl groups of 1 to 5 carbon atoms, lower alkoxy groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group which preferably 5 to 15 carbon atoms.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as in the structural units represented by general formulas (a1"-1) to (a1"-6) shown below, can be exemplified.

[Chemical Formula 10]

(a1"-1)

(a1"-2)

-continued (a1″-3)
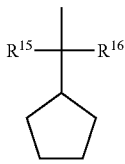

(a1″-4)
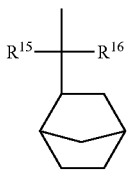

(a1″-5)
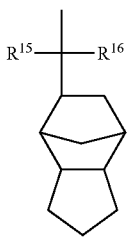

(a1″-6)
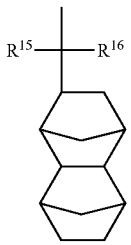

wherein $R^{15}$ and $R^{16}$ represent an alkyl group (which may be linear or branched, and preferably has 1 to 5 carbon atoms)

The tertiary alkyl ester-type acid dissociable, dissolution inhibiting group is preferably represented by formula (p0) shown below, and more preferably formula (p0-1) shown below:

[Chemical Formula 11]

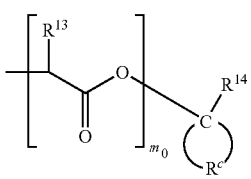
(p0)

wherein $m_0$ represents 0 or 1; $R^{13}$ represents a hydrogen atom or a methyl group; $R^{14}$ represents an alkyl group (which may be either linear or branched, and preferably has 1 to 5 carbon atoms); and $R^c$ is bonded with the carbon atom to which $R^c$ is bonded to form an aliphatic cyclic group.

As $R^c$, the same as the aliphatic cyclic group shown above can be exemplified, and a polycyclic aliphatic cyclic group is preferable:

[Chemical Formula 12]

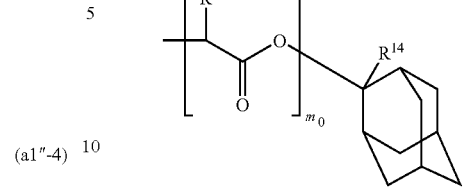
(p0-1)

wherein $m_0$ represents 0 or 1; $R^{13}$ represents a hydrogen atom or a methyl group; and $R^{14}$ represents an alkyl group (which may be either linear or branched, and preferably has 1 to 5 carbon atoms).

$R^{14}$ more preferably has 1 to 3 carbon atoms, and a methyl group or an ethyl group are more preferable.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 13]

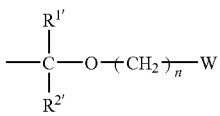
(p1)

wherein $R^{1'}$ and $R^{2'}$ each independently represents a hydrogen atom or a lower alkyl group of 1 to 5 carbon atoms, n represents an integer of 0 to 3, and W represents an aliphatic cyclic group or a lower alkyl group of 1 to 5 carbon atoms.

In formula (p1) above, n represents an integer of 0 to 3, preferably an integer of 0 to 2, more preferably 0 or 1, and most preferably 0.

As the lower alkyl group for $R1'$ and $R^{2'}$, the same as the lower alkyl groups for R above can be exemplified. A methyl group or an ethyl group is preferable, and a methyl group is most preferable.

In the present invention, at least one of $R^{1'}$ and $R^{2'}$ is preferably a hydrogen atom. That is, it is preferable that the acid dissociable, dissolution inhibiting group (p1) is an acetal-type acid dissociable, dissolution inhibiting group represented by general formula (p1-1) shown below.

[Chemical Formula 14]

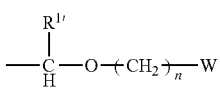
(p1-1)

wherein $R^{1'}$, n and W are as defined above, respectively.

As the lower alkyl group for W, the same as the lower alkyl groups for R above can be exemplified.

As the aliphatic cyclic group for W, any of the aliphatic monocyclic/polycyclic groups which have been proposed for conventional ArF resists and the like can be appropriately selected for use. For example, the same groups described above in connection with the "aliphatic cyclic group" can be exemplified.

As suitable acetal-type, acid dissociable, dissolution inhibiting groups represented by general formula (p1-1) above, for example, groups represented by general formulas (11) to (24) shown below can also be exemplified.

[Chemical Formula 15]

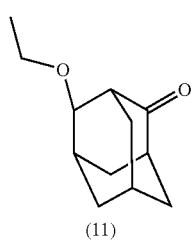
(11)

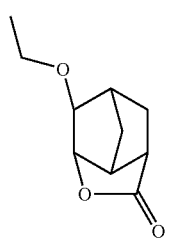
(12)

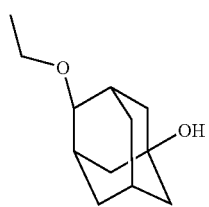
(13)

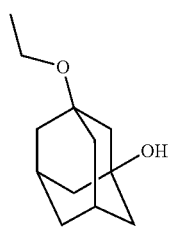
(14)

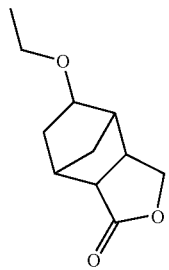
(15)

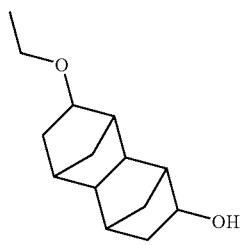
(16)

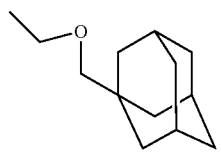
(17)

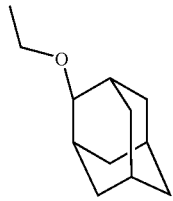
(18)

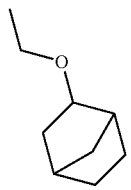
(19)

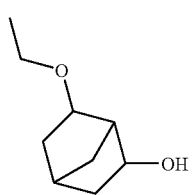
(20)

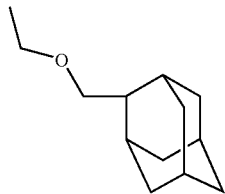
(21)

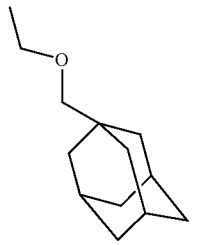
(22)

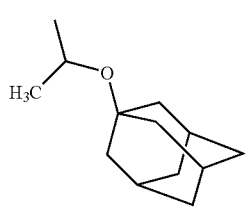
(23)

-continued

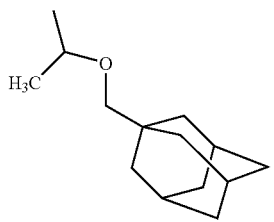
(24)

Further, as the acetal-type acid dissociable, dissolution inhibiting group, a group represented by general formula (p2) shown below can also be exemplified.

[Chemical Formula 16]

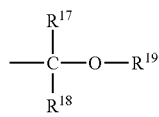
(p2)

Wherein $R^{17}$ and $R^{18}$ each independently represents a linear or branched alkyl group or a hydrogen atom, and $R^{19}$ represents a linear, branched or cyclic alkyl group. Alternatively, $R^{17}$ and $R^{19}$ each independently represents a linear or branched alkylene group, and $R^{17}$ and $R^{19}$ may be bonded to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly preferable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula shown above, $R^{17}$ and $R^{19}$ may each independently represent a linear or branched alkylene group (preferably an alkylene group of 1 to 5 carbon atoms), and $R^{19}$ and $R^{17}$ may be bonded.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

Examples of suitable structural units (a2) include a structural unit represented by general formula (a2-1) shown below, a structural unit represented by general formula (a2-2) shown below, a structural unit represented by general formula (a2-3) shown below, a structural unit represented by general formula (a2-4) shown below; and a structural unit derived from an acrylate ester containing an acid dissociable, dissolution inhibiting group which does not correspond to structural units above.

[Chemical Formula 17]

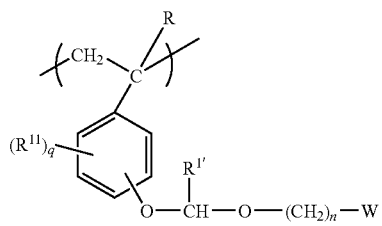
(a2-1)

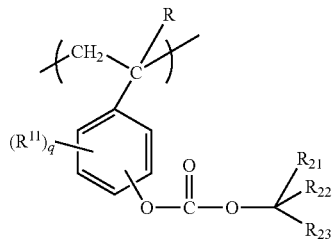
(a2-2)

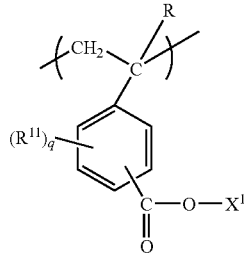
(a2-3)

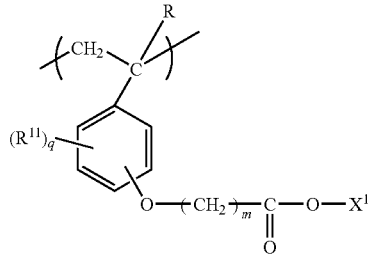
(a2-4)

wherein R, $R^{11}$, q, $R^{1'}$, n and W are as defined above, respectively, and m is 1 to 3. $R^{21}$, $R^{22}$ and $R^{23}$ each independently represents a linear or branched alkyl group. $X^1$ is an acid dissociable, dissolution inhibiting group.

In formulas (a2-1) to (a2-4) above, "—O—CHR$^{1'}$—O—(CH$^2$)$_n$—W", "—O—C(O)—O—C(R$^{21}$)(R$^{22}$)(R$^{23}$)", "—C(O)—O—X$^1$" and "—O—(CH$_2$)$_m$—C(O)—O—X$^1$" may be bonded to any one of the o-position, m-position and p-position of the phenyl group, and the p-position is most preferred since the effects of the present invention are preferable.

$R^{21}$ to $R^{23}$ preferably represent an alkyl group of 1 to 5 carbon atoms, and more preferably an alkyl group of 1 to 3 carbon atoms. Specific examples thereof are the same as those of the lower alkyl group for R above.

$X^1$ is as defined in the above tertiary alkyl ester-type acid dissociable, dissolution inhibiting group or acetal-type acid dissociable, dissolution inhibiting group, and the same as those exemplified above in connection with the explanation of these groups can be exemplified.

M is preferably 1 or 2, and more preferably 1.

More specifically, examples of the structural unit derived from an acrylate ester containing an acid dissociable, dissolution inhibiting group which does not correspond to structural units above include structural units represented by general formulas (a2-11) to (a2-14) shown below:

[Chemical Formula 18]

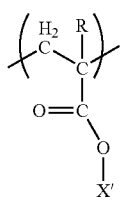
(a2-11)

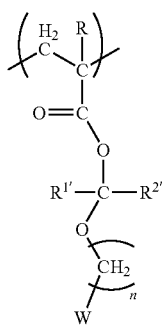
(a2-12)

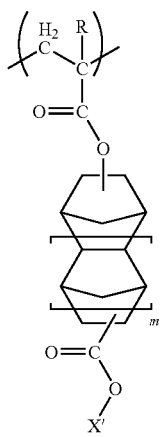
(a2-13)

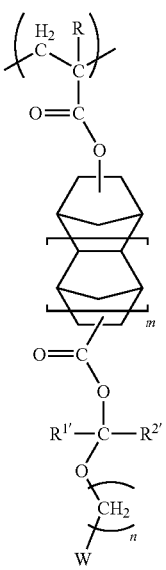
(a2-14)

wherein X' represents a tertiary alkyl ester-type acid dissociable, dissolution inhibiting group; m represents 0 or 1; and R, $R^{1'}$, $R^{2'}$, n and W are as defined above, respectively.

In the formulas above, X' is the same as that in the tertiary alkyl ester-type acid dissociable, dissolution inhibiting group.

Of these, as the structural units (a2), structural units represented by general formulas (a2-1) and (a2-4) above are particularly preferable.

Specific examples of suitable structural unit (a2) are shown below.

[Chemical Formula 19]

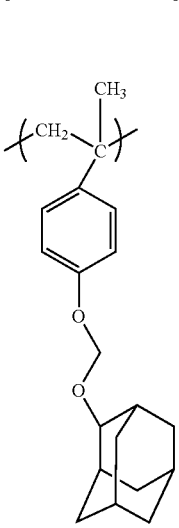
(a2-1-1)

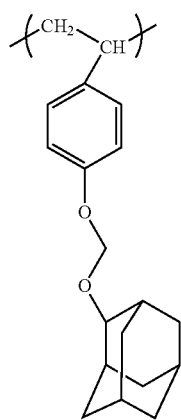 (a2-1-2)
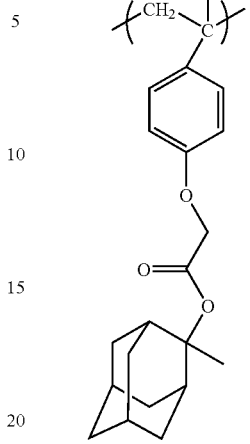 (a2-1-5)
(a2-1-3)
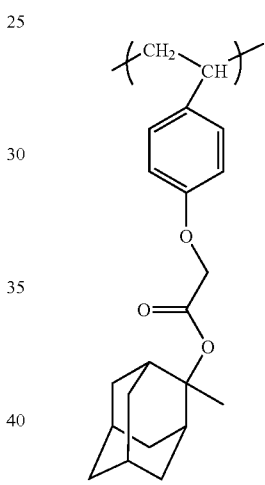 (a2-1-6)
(a2-1-4)
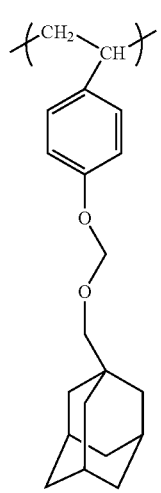
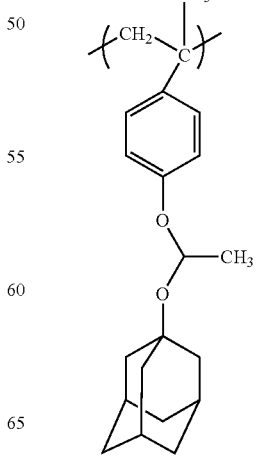 (a2-1-7)

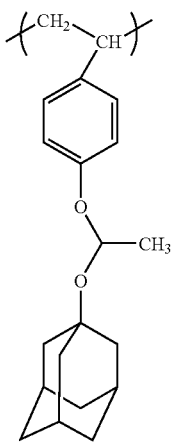

(a2-1-8)

As the structural unit (a2), at least one selected from those represented by chemical formula (a2-1-1) to chemical formula (a2-1-8) is preferable since the effects of the present invention are preferable, and those represented by chemical formulas (a2-1-1), (a2-1-2) and (a2-1-5) to (a2-1-8) are most preferable.

As the structural unit (a2), one type may be used alone, or two or more types may be used in combination.

The amount of the structural unit (a2) is preferably from 5 to 50 mol %, more preferably from 10 to 40 mol %, and still more preferably from 12 to 40 mol %, and particularly preferably from 14 to 35 mol %, based on based on the combined total of all structural units constituting the polymer chain as the arm portion. By making the amount of the structural unit (a2) at least as large as the lower limit of the above-mentioned range, a pattern can be obtained when a positive resist composition is prepared. On the other hand, by making the amount of the structural unit (a2) no more than the upper limit of the above-mentioned range, a good balance can be achieved.

The structural unit (a2) may be a structural unit derived from a monomer containing an acid dissociable, dissolution inhibiting group, for example, a structural unit in which an alkenylphenol type polymer including a p-hydroxystyrene (PHS) segment as a main skeleton of the arm portions is produced and then an acid dissociable, dissolution inhibiting group is introduced into a phenol moiety.

Other Structural Unit

The polymer chain constituting the arm portions of the polymer (A1) may also have a structural unit derived from styrene (hereinafter referred to as a structural unit (a4) which is other than the above-mentioned structural units (a1) and (a2).

For example, when the polymer chain constituting the arm portions is allowed to contain the structural unit (a4), solubility in an alkali developing solution can be adjusted. It is also preferred since dry etching resistance is improved.

In the present description, the term "styrene" is a concenpt that includes styrene, and those in which the hydrogen atoms on the α-position of styrene are substituted with other substituents such as an alkyl group and a halogenated alkyl group.

The term "structural unit derived from an acrylate ester" refers to a structural unit which is formed by the cleavage of the ethylenic double bond of styrene. Regarding styrene, the hydrogen atoms of the phenyl group may be substituted with substituents such as an alkyl group of 1 to 5 carbon atoms.

As suitable structural units (a4), a structural unit represented by general formula (a4-1) shown below can be exemplified.

[Chemical Formula 20]

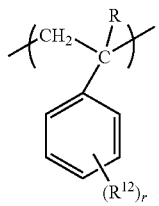

(a4-1)

wherein R is as defined above; $R^{12}$ represents a lower alkyl group of 1 to 5 carbon atoms or a halogen atom; and r represents an integer of 0 to 3.

In general formula (a4-1) above, R and $R^{12}$ are as defined in R and $R^{11}$ in formula (a1-1) above, respectively.

R is an integer of 0 to 3, preferably 0 or 1, and particularly preferably 0 from an industrial point of view.

When r is 1, $R^{12}$ may be substituted on any one of the o-position, m-position and p-position of the phenyl group. When r is 2 or 3, any substitution position can be combined.

As the structural unit (a4), one type may be used alone, or two or more types may be used in combination.

When the arm portions of the polymer (A1) contain a structural unit (a4), the amount of the structural unit (a4) is preferably from 1 to 20 mol %, more preferably from 3 to 15 mol %, and particularly preferably from 5 to 15 mol %, based on the combined total of all structural units constituting the polymer chain as the arm portion. By making the amount of the structural unit (a2) at least as large as the lower limit of the above-mentioned range, the effect of using the structural unit (a4) can be satisfactorily achieved. On the other hand, by making the amount of the structural unit (a4) no more than the upper limit of the above-mentioned range, a good balance can be achieved with the other structural units.

As other structural units of the arm portions of the polymer (A1), any of the multitude of conventional structural units used within resist resins for ArF excimer lasers or KrF excimer lasers such as a structural unit derived from an acrylate ester containing a lactone-containing cyclic group, a structural unit derived from an acrylate ester containing a polar group-containing aliphatic hydrocarbon group, and a structural unit derived from an acrylate ester containing a non-acid-dissociable aliphatic polycyclic group can be used.

In the present description, the term "structural unit derived from an acrylate ester" means a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be exemplified.

The term "α-position of a structural unit derived from an acrylate ester (carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is most preferable.

In the present invention, the arm portions of the polymer (A1) are preferably composed of a polymer chain including the structural unit (a1) and/or the structural unit (a2). As the arm portions (polymer chain), for example, those including structural units (a1) and (a2) and those including structural units (a1), (a2) and (a4) can be exemplified.

As the arm portions, those including two types of structural units represented by general formulas (a-11) to (a-13) shown below are particularly preferable.

[Chemical Formula 21]

(a-11)

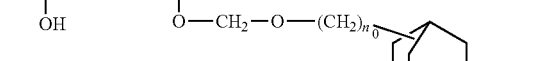
(a-12)

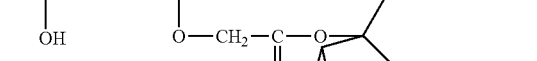
(a-13)

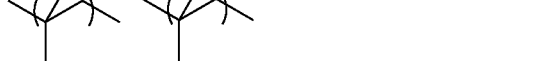

wherein R is as defined above; $n_0$ is 0 or 1; and a plurality of R(s) may be the same or different.

In formula (a-11), R is preferably a hydrogen atom or a methyl group.

It is preferred that —$CH_2$—O—$(CH_2)_n$O— is bonded to the 1st or 2nd position of adamantane.

$n_0$ is particularly preferably 0.

In formulas (a-12) and (a-13), R is as defined above.

(Method of Producing Polymer (A1))

The method of producing a polymer (A1) is not particularly limited and includes, for example, a method in which, using a coupling agent for anionic polymerization as a material for providing a core portion represented by general formula (1) above, the coupling agent for anionic polymerization is reacted with a polymer for providing arm portions obtained by an anionic polymerization method (hereinafter referred to as a polymer (a)) to synthesize a polymer (A1') and all or some of protecting groups for protecting phenolic hydroxy groups in the polymer (A1') are eliminated and, preferably, acid dissociable, dissolution inhibiting groups are introduced to produce a polymer (A1).

Such a method is preferable since it is easy to control each reaction and to control the structure of the polymer (A1).

The method of producing polymer (A1) is explained in detail below.

In the present invention, the coupling agent for anionic polymerization is preferably used as a material for providing the core portion represented by general formula (1) shown above.

Specifically, as the coupling agent for anionic polymerization, a compound represented by general formula (1') shown below can be exemplified since it is excellent in reactivity with a polymer (a) for providing arm portions and a polymer (A1) can be easily produced.

[Chemical Formula 22]

(1')

wherein P, X, Y and a are as defined above, respectively; and Z represents a halogen atom or an epoxy group represented by general formula (6) shown below.

[Chemical Formula 23]

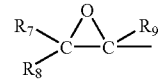
(6)

wherein $R^7$, $R^8$ and $R^9$ each independently represents a hydrogen atom or an alkyl group of 1 to 12 carbon atoms.

In general formula (1') above, P, X, Y and a are as the same as P, X, Y and a defined in general formula (1) shown above.

Z represents a halogen atom or an epoxy group represented by general formula (6) above. Examples of the halogen atom include a chlorine atom, a bromine atom and an iodine atom. Of these, a chlorine atom and bromine atom are preferable and a bromine atom is most preferable.

In the present invention, when Z in general formula (1') above is a chlorine atom, Y to be bonded thereto is preferably a methylene group.

Further, when Z in general formula (1') above is a bromine atom, Y to be bonded thereto is preferably an alkylene group of 1 to 5 carbon atoms, and particularly preferably an alkylene group of 2 carbon atoms (ethylene group).

In general formula (6) above, $R_7$, $R_8$ and $R_9$ each independently represents a hydrogen atom or an alkyl group of 1 to 5 carbon atoms, preferably.

As the coupling agent for anionic polymerization represented by general formula (1') above, for example, a compound represented by general formula (1'-1) shown below can be exemplified.

[Chemical Formula 24]

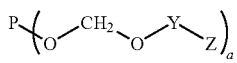
(1'-1)

wherein P, Y, Z and a are as defined above, respectively.

Specifically, as the coupling agent for anionic polymerization, compounds represented by chemical formulas (1'-1-1) to (1'-1-4) shown below can be exemplified.

[Chemical Formula 25]

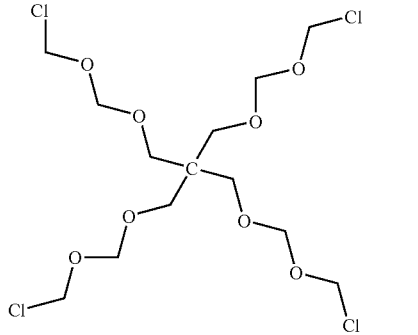
(1'-1-1)

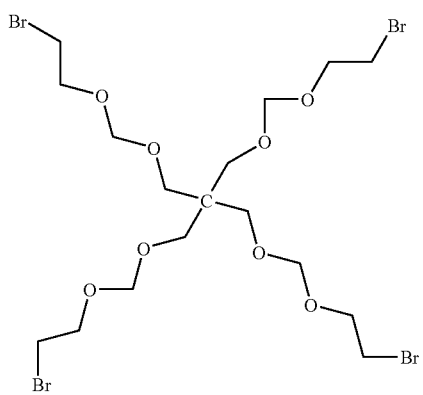
(1'-1-2)

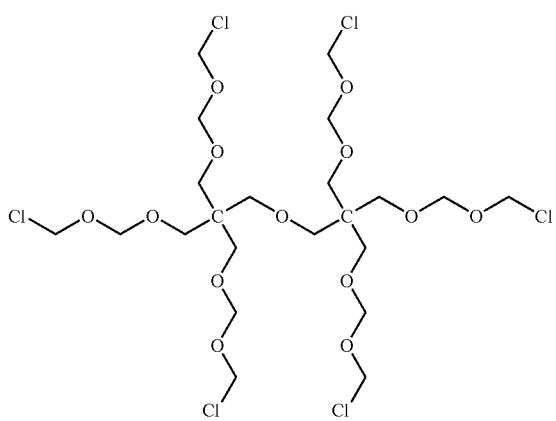
(1'-1-3)

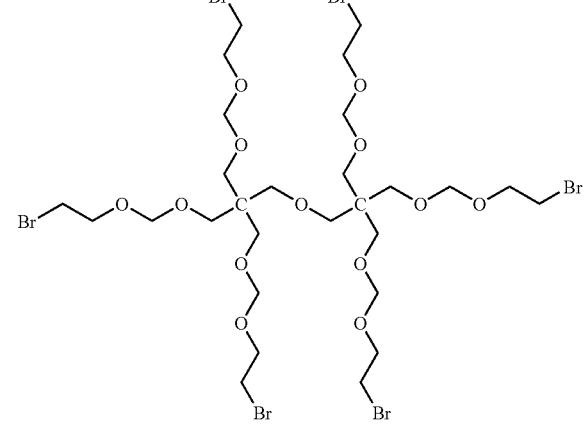
(1'-1-4)

A method of producing a coupling agent for anionic polymerization represented by general formula (1') above is not particularly limited and, for example, a coupling agent for anionic polymerization, containing a linking group represented by general formula (2) above can be produced by reacting a polyhydric (a-valent) alcohol with a chloromethyl halogen-substituted alkylether.

The polymer (a) for providing arm portions can be obtained, for example, by an anionic polymerization reaction of a monomer for providing the above structural unit (a1) (hydroxystyrene derivative compound) and, if necessary, an anionically polymerizable monomer for providing other structural units in the presence of an anionic polymerization initiator.

Examples of the anionic polymerization initiator include an alkali metal atom or an organic alkali metal compound.

Examples of the alkali metal atom include lithium, sodium, potassium and cesium atoms.

As the organic alkali metal compound, alkylated, allylated and arylated compounds of the above alkali metal atoms can be exemplified. Specific examples thereof include ethyl lithium, n-butyl lithium, s-butyl lithium, t-butyl lithium, ethyl sodium, lithium biphenyl, lithium naphthalene, lithium triphenyl, sodium naphthalene, α-methylstyrene sodium di anion, 1,1-diphenylhexyl lithium and 1,1-diphenyl-3-methylpentyl lithium.

An anionic polymerization method of synthesizing a polymer (a) for providing arm portions can be conducted by any of a method of adding dropwise an anionic polymerization initiator in a monomer solution or a monomer mixed solution and a method of adding dropwise a monomer solution or a monomer mixed solution in a solution containing an anionic polymerization initiator. Of these, a method of adding dropwise a monomer solution or a monomer mixed solution in a solution containing an anionic polymerization initiator is preferable as it is easy to control a molecular weight and molecular weight distribution.

The anionic polymerization method of synthesizing a polymer (a) is preferably conducted under an atmosphere of an inert gas such as nitrogen or argon in an organic solvent at a temperature of −100 to 50° C., and more preferably −100 to 40° C.

Examples of the organic solvent used in the anionic polymerization method of synthesizing a polymer (a) include organic solvents used usually in an anionic polymerization method, for example, aliphatic hydrocarbons such as n-hexane and n-heptane; alicyclic hydrocarbons such as cyclohexane and cyclopentane; aromatic hydrocarbons such as benzene and toluene; ethers such as diethylether, tetrahydrofuran (THF) and dioxane; anisole, hexamethylphospholamide and the like. Of these, toluene, n-hexane and THF are preferable.

These solvents can be used individually, or in combination as a mixed solvent.

When the polymer (a) for providing arm portions is a copolymer, the polymer can be in any polymerization form such as a random copolymer, a partial block copolymer or a complete block copolymer. These polymers can be appropriately synthesized by selecting the method of adding a monomer used for polymerization.

The reaction of linking a polymer (a) for providing arm portions with a coupling agent for anionic polymerization for providing a core portion to synthesize a polymer (A1') can be conducted by adding a coupling agent for anionic polymerization in the polymerization reaction solution after completion of anionic polymerization of synthesizing polymer (a). Such a reaction is preferably conducted under an atmosphere of an inert gas such as nitrogen or argon in an organic solvent at a temperature of −100 to 50° C., and more preferably −80 to 40° C. Thus, the structure of the polymer (A1') can be controlled and also a polymer having narrow molecular weight distribution can be obtained.

Further, the synthesis reaction of polymer (A1') can be continuously conducted in an organic solvent used in the anionic polymerization reaction of synthesizing polymer (a) for providing arm portions, and also can be conducted after changing the composition by newly adding a solvent, or replacing the solvent by another solvent. The solvent, which can be used herein, may be the same organic solvent as that used in the anionic polymerization reaction of synthesizing polymer (a) for providing arm portions.

The reaction of eliminating protecting groups protecting phenolic hydroxy groups from the obtained polymer (A1') is preferably conducted in the presence of solvents, for example, the solvents exemplified in the polymerization reaction; alcohols such as methanol and ethanol; ketones such as acetone, methyl ethyl ketone and methyl isobutyl ketone (MIBK); polyhydric alcohol derivatives such as methyl cellosolve and ethyl cellosolve; and water alone, or a mixed solvent of two or more types at a temperature of room temperature or higher and 150° C. or lower using catalysts, for example, acidic reagents such as hydrochloric acid, sulfuric acid, oxalic acid, hydrogen chloride gas, hydrobromic acid, p-toluenesulfonic acid, 1,1,1-trifluoroacetic acid, and bisulfate represented by $LiHSO_4$, $NaHSO_4$ or $KHSO_4$. All or some of the protecting groups protecting phenolic hydroxy groups can be eliminated by appropriately using types and concentrations of solvents, types and amounts of catalysts, and reaction temperatures and reaction times in this reaction.

When the arm portions of the polymer (A1) contain a structural unit derived from an acrylate ester, ester groups of the structural unit can be converted into carboxy groups by hydrolysis.

This hydrolysis can be conducted by a method known in the relevant technical field and, for example, conducted by acid hydrolysis under the same conditions as those for elimination of the above protecting groups. Preferably, hydrolysis of the ester groups can be conducted simultaneously with the elimination of protecting groups of phenolic hydroxyl groups. The thus obtained polymer (A1) containing a structural unit derived from an acrylate ester in the arm portion is particularly preferably a resist material since it has high alkali solubility.

After eliminating protecting groups protecting phenolic hydroxy groups from the polymer (A1'), protecting groups such as acid dissociable, dissolution inhibiting groups exemplified above in connection with the explanation of the above structural unit (a2) may be newly introduced.

These protecting groups can be introduced by a known method (for example, a method of reacting a protecting group precursor compound containing halogen atoms in the presence of a basic catalyst).

The polymer (A1) obtained by the above method can be used without being purified, or used after purification, if necessary.

This purification can be conducted by a method used usually in the relevant technical field and can be conducted, for example, by a fractional reprecipitation method. In the fractional reprecipitation method, reprecipitation is preferably conducted using a mixed solvent of a solvent having high polymer solubility and a solvent having low polymer solubility. For example, purification can be conducted by a method of dissolving a polymer (A1) with heating in a mixed solvent, followed by cooling, or by a method of dissolving a polymer (A1) in a solvent having high polymer solubility and adding a solvent having low polymer solubility to precipitate the polymer (A1).

Mw/Mn of the polymer (A1) is preferably from 1.01 to 3.00, more preferably from 1.01 to 2.00, and still more preferably from 1.01 to 1.50. By making Mw/Mn of the polymer (A1) at least as large as the lower limit of the above-mentioned range, solubility in a resist solvent enough to use as a resist can be attained. On the other hand, by making Mw/Mn of the polymer (A1) no more than the upper limit of the above-mentioned range, satisfactory dry etching resistance and resist pattern shape are attained.

Mn of the polymer (A1) is preferably from 1,000 to 1,000,000, more preferably from 1,500 to 500,000, still more preferably from 1,500 to 50,000, and particularly preferably from 2,000 to 20,000. When Mn of the polymer (A1) is within the above-mentioned range, the effects of the present invention are improved.

In the component (A), as the polymer (A1), one type may be used alone, or two or more types may be used in combination In addition to the polymer (A1), other polymer compounds used for a positive resist composition, for example, a hydroxystyrene resin, a novolak resin and an acrylic resin can be used in combination as the component (A).

The amount of the polymer (A1) in the component (A) is preferably 50% by mass or more, more preferably 70% by mass or more, particularly preferably 80% by mass or more, and most preferably 100% by mass.

The content of the component (A) in the positive resist composition of the present invention may be adjusted according to the thickness of the resist film to be formed.

<Component (B)>

As the component (B), there is no particular limitation, and those proposed as acid generators for conventional chemically amplified photoresist can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be preferably used.

[Chemical Formula 26]

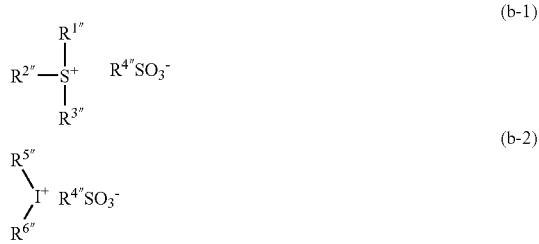

wherein $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is most preferable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms, hydroxyl groups, —O—$R^q$—C(=O)—O—$X^1$ (i which $R^q$ is a single bond or an alkylene group of 1 to 5 carbon atoms, and $X^1$ is as defined above). The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, particularly preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ is a phenyl group or a naphthyl group.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be exemplified.

As suitable cation moieties of the compound represented by formula (b-1), cation moieties represented by formulas (I-1-1) and (I-1-2) shown below can be exemplified.

[Chemical Formula 27]

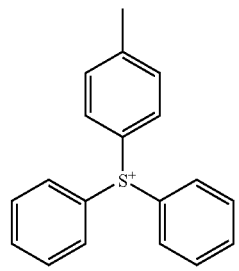

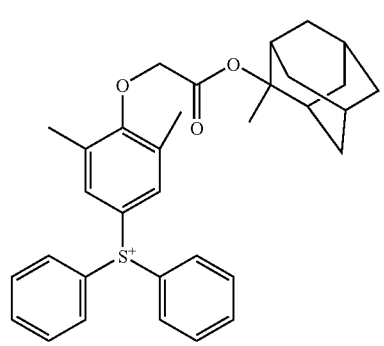

$R^{4\prime\prime}$ represents a linear, branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and particularly preferred is a fluorinated alkyl group (perfluoroalkyl group) in which all hydrogen atoms are substituted with fluorine atoms because the acid strength increases.

$R^{4\prime\prime}$ is most preferably a linear or cyclic alkyl group or fluorinated alkyl group.

In formula (b-2), $R^{5\prime\prime}$ to $R^{6\prime\prime}$ each independently represents an aryl group or alkyl group. At least one of $R^{5\prime\prime}$ to $R^{6\prime\prime}$ represents an aryl group. It is preferable that both of $R^{5\prime\prime}$ and $R^{6\prime\prime}$ represent an aryl group.

As the aryl group for $R^{5''}$ to $R^{6''}$, the same as the aryl groups for $R^{1''}$ to $R^{3''}$ can be exemplified.

As the alkyl group for $R^{5''}$ to $R^{6''}$, the same as the alkyl groups for $R^{1''}$ to $R^{3''}$ can be exemplified.

It is most preferable that both of $R^{5''}$ to $R^{6''}$ represents a phenyl group.

As $R^{4''}$ in formula (b-2), the same as those mentioned above for $R^{4'''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety of these onium salts is replaced by an anion moiety represented by general formula (b1) shown above may be used.

[Chemical Formula 28]

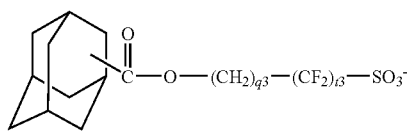

(b1)

wherein q3 is an integer of 1 to 12, and t3 is an integer of 1 to 3.

Further, onium salt-based acid generators in which the anion moiety in general formula (b-1) or (b-2) above is replaced by an anion moiety represented by general formula (b-3) or (b-4) shown below (the cation moiety is the same as (b-1) or (b-2)) may be used.

[Chemical Formula 29]

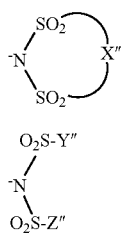

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" is a linear or branched alkylene group in which at least one hydrogen atom has been substituted with a fluorine atom, and the alkylene group preferably has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

It is preferable that the number of carbon atoms of the alkylene group for X" or the number of carbon atoms of the alkyl group for Y" and Z" is as small as possible because solubility in a resist solvent is satisfactory within the above-mentioned range of the number of carbon atoms.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or an electron beam is improved.

The fluorination ratio of the alkylene group or alkyl group is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 30]

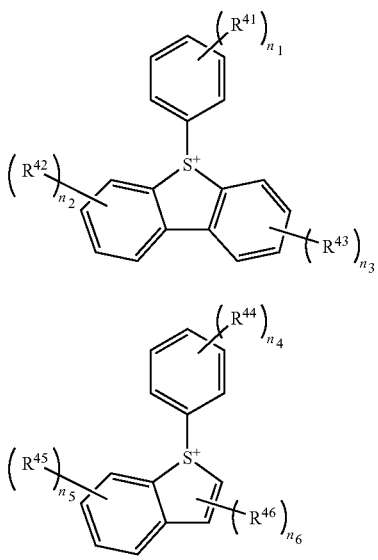

wherein $R^{41}$ to $R^{46}$ each independently represents an alkyl group, an acetyl group, an alkoxy group, a carboxy group, a hydroxyl group or a hydroxyalkyl group; $n_1$ to $n_5$ each independently represents an integer of 0 to 3; and n6 represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used.

Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above. Among these, fluorinated alkylsulfonic acid ions are preferable, more preferably fluorinated alkylsulfonic acid ions of 1 to 4 carbon atoms, and linear perfluoroalkylsulfonic acid ions of 1 to 4 carbon atoms are particularly desirable. Specific examples include a trifluoromethylsulfonic acid ion, a heptafluoro-n-propylsulfonic ion and a nonafluoro-n-butylsulfonic acid ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 31]

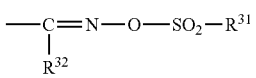

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 32]

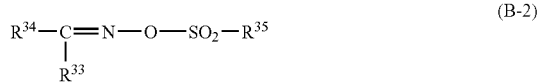

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 33]

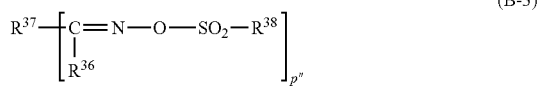

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is most preferable.

In general formula (B-3) above, the alkyl group having no substituent and the halogenated alkyl group for $R^{36}$ above are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$ above.

As the alkyl group having no substituent or the halogenated alkyl group for $R^{38}$, the same one as the alkyl group having no substituent or the halogenated alkyl group for $R^{35}$ above can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 34]

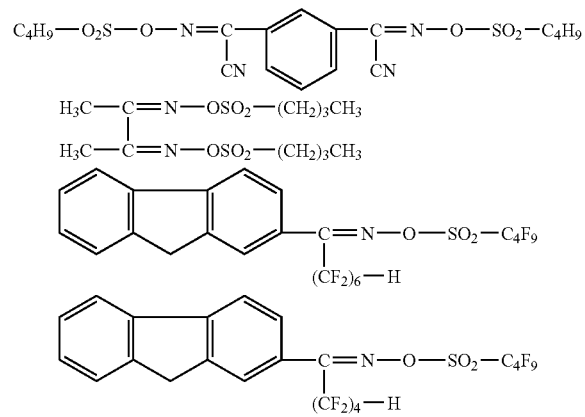

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis (cyclohexylsulfonyldiazomethylsulfonyl) decane, may be exemplified.

As the component (B), one type of acid generator may be used, or two or more types may be used in combination.

In the present invention, an onium salt containing a fluorinated alkylsulfonic acid ion as an anion is preferably used as the component (B).

The total amount of the component (B) within the positive resist composition of the present invention is from 0.5 to 60 parts by weight, more preferably 1 to 40 parts by weight, and most preferably from 5 to 38 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

Component (D)

It is preferable that the positive resist composition of the present invention further contains a nitrogen-containing organic compound (D) (hereafter referred to as the component (D)) as an optional component.

The component (D) is not particularly limited as long as it can serve as an acid diffusion controller, in other words, a quencher of trapping acid generated from the component (B) upon exposure. A multitude of these components (D) have already been proposed, and any of these known compounds may be used, although an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, tri-n-pentylamine and tri-n-octylamine are more preferable, and tri-n-pentylamine is most preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1, 5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

In the present invention, trialkylamine of 5 to 10 carbon atoms is preferably used as the component (D).

The component (D) is typically used in an amount within a range from 0.01 to 5.0 parts by weight, relative to 100 parts by weight of the component (A). By making the amount within the above range, resist pattern shape, and post exposure stability of the latent image formed by the pattern-wise exposure of the resist layer are improved.

Optional Component

Component E

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

Component (S)

The positive resist composition of the present invention can be prepared by dissolving materials in an organic solvent (hereafter, frequently referred to as a "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), ethyl lactate (EL) and γ-butyrolactone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 1.5 to 15% by weight.

The positive resist composition of the present invention has the effects capable of forming a resist pattern with high resolution. The reasons for these have not yet been elucidated, but are presumed as follows.

The positive resist composition of the present invention contains a polymer (A1) including a core portion containing a linking group which can be cleaved under action of acid, and arm portions composed of a polymer chain obtained by an anionic polymerization method. The polymer (A1) is a monodisperse polymer compound having narrower molecular weight distribution than that of a base resin obtained by a radical polymerization method since the polymer chain constituting the arm portions is obtained by an anionic polymerization method and thus it is easy to control the molecular weight.

Further, since a bond of a main chain of the polymer (A1) is cleaved under action of acid in a linking group of a core portion, the polymer (A1) as exposed portions exhibits narrow molecular weight distribution even after exposure, and thus forms a monodisperse system. Further, since the bond of the main chain of the polymer (A1) is cleaved in the linking group of the core portion, the molecular weight of exposed portions decreases when compared with that of unexposed portions of the polymer (A1), and thus solubility of exposed portions in an alkali developing solution increases more. Further, since the molecular weight of the polymer (A1) of exposed portions is quite different from that of unexposed portions, a difference in solubility in an alkali developing solution of exposed portions and unexposed portions (so-called contrast) increases. In terms of increasing difference between the molecular weight of exposed portions and the molecular weight of unexposed portion, the number of arm portions branched from a core portion is preferably larger.

As a result, it is presumed that the positive resist composition of the present invention has the effects capable of forming a resist pattern with high resolution.

According to the positive resist composition of the present invention, a resist pattern having a good shape with reduced roughness can be formed.

Method of Forming a Resist Pattern

The method of forming a resist pattern according to the present invention includes: forming a resist film on a substrate using a positive resist composition of the present invention; conducting exposure of the resist film; and alkali-developing the resist film to form a resist pattern.

The method for forming a resist pattern according to the present invention can be performed, for example, as follows.

Firstly, the above positive resist composition is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an electron beam lithography system or the like, the resist film is selectively irradiated with electron beam (EB) (exposure) through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) can be exemplified.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to EB or EUV.

EXAMPLES

As follows is a description of examples of the present invention, although the scope of the present invention is by no way limited by these examples.

Resin Component (A)

In Example 1 and Comparative Example 1, a polymer (A)-1 and a polymer (A)-2 used as the component (A) were produced by the synthesis method shown below.

Production Example 1

Production of Polymer (A)-1

Production Example 1-1

Synthesis of a Coupling Agent for Anionic Polymerization for Providing a Core Portion (i) Synthesis of pentaerythritol-tetra(2-chloroethoxymethyl)ether Under a nitrogen atmosphere, to 13.0 g of pentaerythritol, 247.0 g of acetone, 80.2 g of diisopropylethylamine and 80.1 g of 2-chloroethylchloromethylether were added, followed by maintaining at 30° C. for 4 hours while stirring. To the reaction mixture, ethyl acetate was added and the organic layer was washed four times with an aqueous oxalic acid solution and ion-exchange water. The obtained organic layer was concentrated under reduced pressure, concentrated to obtain 47.4 g (yield: 98%) of pentaerythritol-tetra(2-chloroethoxymethyl)ether.

(ii) Synthesis of pentaerythritol-tetra(2-bromoethoxymethyl)ether

Under a nitrogen atmosphere, to 11.2 g of pentaerythritol-tetra(2-chloroethoxymethyl)ether obtained in (i) above, 560.0 g of hexamethylphosphoric acid triamide, 144.7 g of bromoethane and 1.8 g of sodium bromide were added, followed by maintaining at 80° C. for 24 hours while stirring. The reaction mixture was cooled to room temperature and the reaction mixture was concentrated under reduced pressure. To the obtained concentrated mixture, methyl t-butyl ether was added and the organic layer was washed four times with ion-exchange water. The organic layer was dried over anhydrous magnesium sulfate added thereto. After filtration, the residue was concentrated under reduced pressure to obtain 12.3 g (yield: 81%) of pentaerythritol-tetra(2-bromoethoxymethyl)ether.

Production Example 1-2

Synthesis of Monodisperse Polymer (a) for Providing Arm Portions (Polymer Chain)

Under a nitrogen atmosphere, 119.5 g of tetrahydrofuran (hereinafter abbreviated to "THF") was cooled to −60° C. After stirring was continued, 15 mmol of s-butyl lithium was added while maintaining at −60° C. After stirring was further continued, 24.5 g of p-ethoxyethoxystyrene (hereinafter abbreviated to "PEES") was added dropwise over 50 minutes while maintaining at −60° C. and the reaction was further continued for 1 hour. At this stage, a small amount of the reaction solution was collected and the reaction was terminated by methanol. Analysis was conducted by gel permeation chromatography (hereinafter abbreviated to "GPC"). As a result, the obtained PEES polymer was a monodisperse polymer (a) of Mn=1,450 and Mw/Mn=1.20 (polystyrene equivalent values).

Production Example 1-3

Reaction of Coupling Agent for Anionic Polymerization with Monodisperse Polymer (a)

While maintaining the reaction system of Production Example 1-2 at −60° C., 3.2 g of pentaerythritol-tetra(2-bromoethoxymethyl)ether obtained in Production Example 1-1 was added dropwise over 10 minutes the reaction was further continued for 1 hour. After the reaction was terminated by adding methanol to the reaction system, and analysis was conducted by GPC. As a result, the obtained acid-decomposable polymer was a monodisperse polymer (A1') of Mn=3,670 and Mw/Mn=1.24 (polystyrene equivalent values).

Since an increase in the molecular weight was observed while maintaining monodispersing of a polymer before and after the reaction of pentaerythritol-tetra(2-bromoethoxymethyl)ether, it was confirmed that a monodisperse polymer (A1') having a star shape was obtained as designed.

Production Example 1-4

Hydrolysis of Monodisperse Polymer (A1') (Elimination of Protecting Group of Arm Portions)

To the polymeric solution obtained in Production Example 1-3, methyl isobutyl ketone (hereinafter abbreviated to "MIBK") was added and the organic layer was washed twice with ion-exchange water. The organic layer was subjected to a concentration operation under reduced pressure to prepare a MIBK solution containing 40% by weight of a polymer, and also a solution containing 20% by weight of a polymer was prepared by isopropyl alcohol (hereinafter abbreviated to "IPA").

To 100 parts by weight of this solution, 1 part by weight of oxalic acid dihydrate and 2 parts by weight of ion-exchange water were added, followed by heating to 50° C. After stirring was continued, the reaction was further continued for 6 hours while maintaining at 50° C.

In this reaction, $^{13}$C-NMR of the polymer was compared before and after the reaction. An absorption attributed to a PEES polymer observed at about 117 ppm disappeared after the reaction and an absorption attributed to a p-hydroxystyrene polymer was newly observed at about 115 ppm. Furthermore, it was confirmed that a peak attributed to O—CH$_2$—O observed at about 96 ppm is maintained before and after hydrolysis.

With respect to the polymer after the reaction, the measurement was conducted by GPC. As a result, Mn was 2,560 (polystyrene equivalent value) and a large change in peak shape was not observed before and after the reaction.

As described above, the hydrolysis reaction was conducted as designed to obtain an alkenylphenol-type polymer containing a p-hydroxystyrene (hereinafter abbreviated to "PHS") segment as a main skeleton. It was also confirmed that the O—CH$_2$—O bond introduced into the main chain skeleton is maintained and a star shape is maintained.

Production Example 1-5

Introduction of a Methoxyadamantyl Group

MIBK was added to the polymer solution of Production Example 1-4 and the organic layer was washed three times with ion-exchange water. The organic layer was subjected to a concentration operation under reduced pressure to prepare a solution containing 50% by weight of a polymer and then a solution containing 10% by weight a polymer was prepared.

To 130.5 g of the obtained polymer solution, 2.2 g of 60% sodium hydride was added, followed by maintaining at room temperature for 30 minutes while continuously stirring. Then, 4.8 g of 2-chloromethoxyadamantane was added dropwise over 5 minutes and the reaction was continued at room temperature for 12 hours.

After the reaction was terminated by adding an aqueous oxalic acid solution to the reaction system, MIBK was added and the organic layer was washed three times with ion-exchange water. Then, the organic layer was replaced by a propylene glycol monomethyl ether acetate (hereinafter abbreviated to "PGMEA") solution through a concentration operation under reduced pressure.

The obtained polymer was confirmed by $^{13}$C-NMR. As a result, absorptions attributed to units in which methoxyadamantyl groups are introduced into PHS (hereinafter abbreviated to "PHS-MOAd") were newly observed at about 82 ppm, 93 ppm and 116 ppm. The ratio of PHS units to PHS-MOAd was 75/25. Furthermore, it was confirmed that a peak attributed to O—CH$_2$—O introduced into the main chain skeleton at about 96 ppm is maintained.

With respect to the polymer after the reaction, measurement was conducted by GPC. As a result, the polymer is a monodisperse polymer having Mn=2,790 and Mw/Mn=1.3 (polystyrene equivalent values) and a change in peak shape was not observed before and after the reaction.

As described above, it was confirmed that the introduction of methoxyadamantyl groups is conducted as designed to obtain an alkenylphenol-type polymer containing a PHS/PHS-MOAd segment as a main skeleton, and that an O—CH$_2$—O bond introduced into the main chain skeleton is maintained and a star shape is maintained.

The structure of the polymer (A)-1 produced by the above synthesis method is shown below.

In chemical formulas shown below, the subscript numerals on the lower right side of brackets indicate the percentage (mol %, composition ratio) of the respective structural units based on the combined total of all structural units constituting the polymer chain as arm portions of the polymer (A)-1 and each percentage was calculated by carbon NMR.

[Chemical Formula 35]

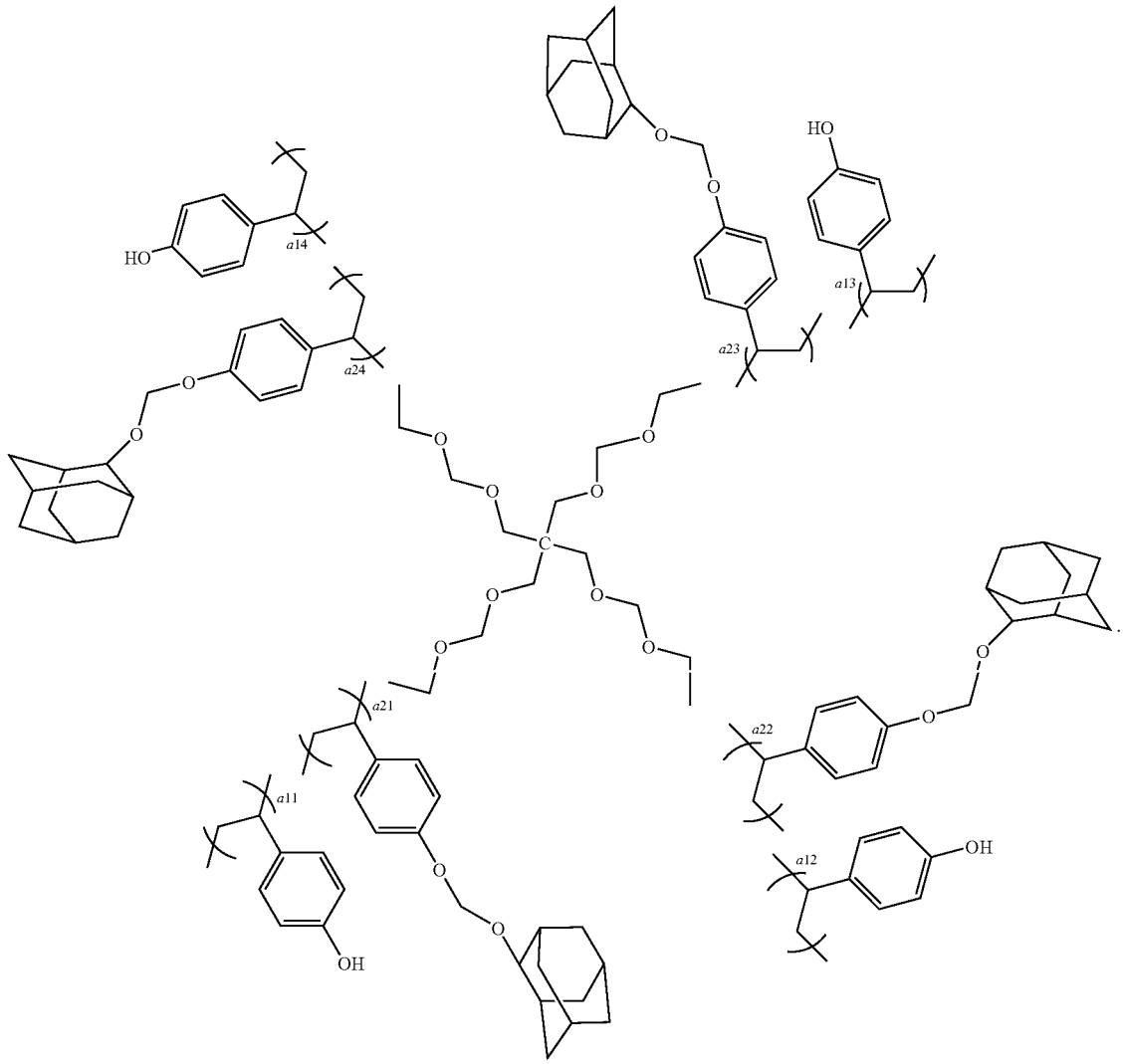

[(a11+a12+a13+a14)/(a21+a22+a23+a24)=75/25 (molar ratio); Mn=2,790, Mw/Mn=1.3]

Production Example 2

Production of polymer (A)-2

10 g of poly-4-hydroxystyrene (Mw=4,000, Mw/Mn=1.1) was dissolved in 100 ml of THF and 0.92 g of sodium hydride was added. To the solution, 4.37 g of adamantoxymethyl chloride was added, followed by stirring at room temperature for 20 hours. After stirring, the reaction was terminated by adding water and the reaction solution was concentrated. The reaction solution was diluted with 400 ml of water, extracted three times with 100 ml of ethyl acetate, and then washed in turn with hydrochloric acid, an aqueous saturated $NaHCO_3$ solution and an aqueous saturated NaCl solution. The obtained solution was concentrated, purified by reprecipitation with an ethyl acetate-n-heptane system and then dried to obtain a white solid.

GPC analysis revealed that the obtained polymer (A)-2 has Mw=4,200 and Mw/Mn=1.1 (polystyrene equivalent values).

Also, the composition ratio (molar ratio) was calculated by carbon NMR and proton NMR.

The structure of the polymer (A)-2 produced in Production Example 2 is shown below.

[Chemical Formula 36]

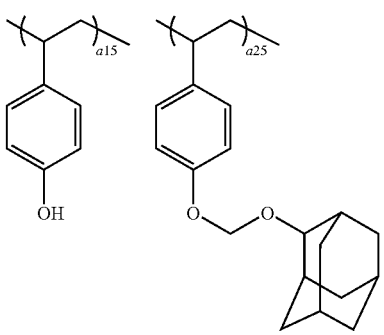

[a15/a25=75/25 (molar ratio); Mw=4,200, Mw/Mn=1.1]

Production Example 3

Production of Star Polymers (Polymers (A)-3 to (A)-11)

Production Examples 3-1 to 3-2

Synthesis of Arm Portions (Polymer Chains) and Synthesis of Acid Decomposable Polymer In the same manner as in Production Example 1-2, except that the amount of PEES added dropwise was changed as shown in Table 1, acid decomposable polymers, each having a different molecular weight of the polymer chain shown in Table 1 were obtained.

TABLE 1

| | Amount of PEES added dropwise | Amount of polymer Mn | Polymer chain Mw/Mn | Acid decomposable polymer Mn | Acid decomposable polymer Mw/Mn |
|---|---|---|---|---|---|
| Production Example 3-1 | 16.3 g | 990 | 1.22 | 3,000 | 1.26 |
| Production Example 3-2 | 32.8 g | 1,860 | 1.10 | 4,100 | 1.34 |

Production Examples 3-3 to 3-4

Hydrolysis of PEES (Elimination of Protecting Group)

In the same manner as in Production Example 1-3, except that the polymeric solution obtained in Production Example 3-1 or Production Example 3-2 was used in place of the polymeric solution obtained in Production Example 1-2, star polymers containing a PHS segment shown in Table 2 as the main skeleton of arm portions were obtained.

TABLE 2

| | Polymeric solution | Star polymer Mn | Star polymer Mw/Mn |
|---|---|---|---|
| Production Example 3-3 | Production Example 3-1 | 1,830 | 1.29 |
| Production Example 3-4 | Production Example 3-2 | 2,660 | 1.31 |

Production Examples 3-5 to 3-13

Introduction of Methyl Adamantyl Acetate Group

To each of the polymer solutions obtained in Production Example 1-3, Production Example 3-3 and Production Example 3-4, MIBK was added and the organic layer was washed three times with ion-exchange water. The organic layer was concentrated under reduced pressure to prepare a solution containing 50% by weight of a polymer and then a solution containing 10% by weight of a polymer was prepared by acetone.

To 50.0 g of the obtained polymer solution, 3.5 g of potassium carbonate was added, followed by maintaining at room temperature for 30 minutes under stirring. Then, methyl adamantyl iodoacetate (parts shown in Table 3) was added and the reaction was continued at 35° C. for 8 hours.

To the reaction system, MIBK was added and the organic layer was washed once with an aqueous oxalic acid solution, and then washed three times with ion-exchange water. The organic layer was replaced by a PGMEA solution through a concentration operation under reduced pressure.

TABLE 3

| | Polymer | Methyl adamantyl iodoacetate |
|---|---|---|
| Production Example 3-5 | Production Example 1-3 | 1.6 g |
| Production Example 3-6 | | 2.8 g |
| Production Example 3-7 | | 4.0 g |
| Production Example 3-8 | Production Example 3-3 | 1.6 g |
| Production Example 3-9 | | 2.8 g |
| Production Example 3-10 | | 3.8 g |
| Production Example 3-11 | Production Example 3-4 | 1.8 g |
| Production Example 3-12 | | 3.0 g |
| Production Example 3-13 | | 4.3 g |

With respect to the obtained polymer, measurement by $^{13}$C-NMR was conducted. As a result, absorptions attributed to units in which methyl adamantyl acetate groups are introduced into PHS (hereinafter referred to as PHS-OAdE) were newly observed at about 89 ppm, 114 ppm and 169 ppm.

The ratio of PHS units to PHS-OAdE is as shown in Table 4.

TABLE 4

| | PHS/PHS-OAdE |
|---|---|
| Production Example 3-5 | 86/14 |
| Production Example 3-6 | 76/24 |
| Production Example 3-7 | 66/34 |
| Production Example 3-8 | 86/14 |
| Production Example 3-9 | 77/23 |
| Production Example 3-10 | 67/33 |
| Production Example 3-11 | 86/14 |
| Production Example 3-12 | 82/18 |
| Production Example 3-13 | 73/27 |

Further, it was confirmed that a peak at about 96 ppm attributed to a —O—CH$_2$—O-bond introduced into the core portion of a polymer is maintained.

With respect to the polymer after the reaction, GPC measurement was conducted. As a result, the polymer is a monodisperse polymer having Mn and Mw/Mn shown in Table 5. A change in peak shape of GPC was not observed before and after introducing methyl adamantyl acetate groups.

TABLE 5

| | Mn | Mw/Mn |
|---|---|---|
| Production Example 3-5 | 2,900 | 1.23 |
| Production Example 3-6 | 2,600 | 1.25 |
| Production Example 3-7 | 3,200 | 1.22 |
| Production Example 3-8 | 2,500 | 1.13 |
| Production Example 3-9 | 2,700 | 1.13 |
| Production Example 3-10 | 3,000 | 1.13 |
| Production Example 3-11 | 3,700 | 1.12 |
| Production Example 3-12 | 3,800 | 1.12 |
| Production Example 3-13 | 4,300 | 1.10 |

From the results shown above, it was confirmed that an alkenylphenol-based polymer containing a PHS/PHS-OAdE segment as the main skeleton of arm portions is obtained, and that an acetal bond introduced into the core portion of the polymer is maintained and the polymer maintains a star shape.

The polymers obtained in Production Examples 3-5 to 3-13 are referred to as shown in Table 6.

TABLE 6

| | Name |
|---|---|
| Production Example 3-5 | Polymer-(A)-3 |
| Production Example 3-6 | Polymer-(A)-4 |
| Production Example 3-7 | Polymer-(A)-5 |
| Production Example 3-8 | Polymer-(A)-6 |
| Production Example 3-9 | Polymer-(A)-7 |
| Production Example 3-10 | Polymer-(A)-8 |
| Production Example 3-11 | Polymer-(A)-9 |
| Production Example 3-12 | Polymer-(A)-10 |
| Production Example 3-13 | Polymer-(A)-11 |

The structures of the polymers (A)-3 to (A)-11 are shown below. In the chemical formulas shown below, the subscript numerals on the lower right side of brackets indicate the percentage (mol %, composition ratio) of the respective structural units based on the combined total of all structural units constituting the polymer chain as arm portions of the polymers (A)-3 to (A)-11 and each percentage was calculated by $^{13}$C-NMR as shown in Table 4.

[(b11+b12+b13+b14)/(b21+b22+b23+b24)=percentage (molar ratio) of each structural unit]

Production Example 4

Production of Star Polymer (Polymer (A)-13)

Production Example 4-1

Synthesis of Coupling Agent for Anionic Polymerization

Under a nitrogen atmosphere, to 12.3 g of dipentaerythritol, 234.1 g of acetone, 50.1 g of diisopropylethylamine and 50.0 g of 2-chloroethyl chloromethyl ether were added, followed by maintaining at 50° C. for 4 hours under stirring. To the reaction mixture, ethyl acetate was added and the organic layer was washed four times with an aqueous oxalic acid solution and ion-exchange water. The obtained organic layer was concentrated under reduced pressure to obtain 39.0 g (yield: 99%) of dipentaerythritol-hexa(2-chloroethoxymethyl)ether.

Under a nitrogen atmosphere, to 20.0 g of dipentaerythritol-hexa(2-chloroethoxymethyl) ether, 480.0 g of hexameth-

[Chemical Formula 37]

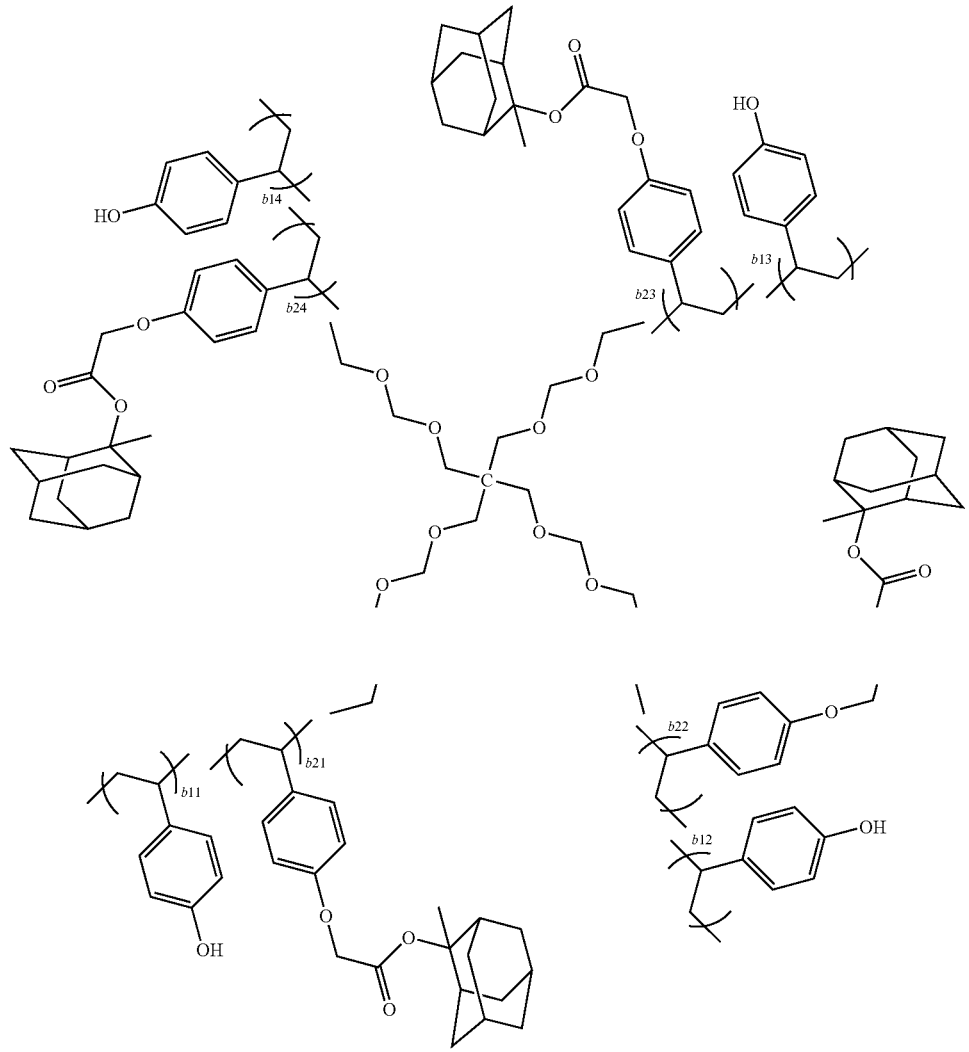

ylphosphoric acid triamide, 161.6 g of bromoethane and 3.1 g of sodium bromide were added, followed by maintaining at 80° C. for 3 hours under stirring. Then, the reaction mixture was concentrated under reduced pressure. To the obtained concentrated mixture, 107.7 g of bromoethane was newly added, followed by maintaining at 80° C. for 3 hours under stirring. The reaction mixture was concentrated under reduced pressure and methyl t-butyl ether was added to the obtained concentrated mixture, and then the organic layer was washed four times with ion-exchange water. Then, the organic layer was dried over anhydrous magnesium sulfate added thereto. After filtration, the residue was concentrated under reduced pressure to obtain 10.5 g (yield: 39%) of dipentaerythritol-hexa(2-bromoethoxymethyl)ether as a coupling agent for anionic polymerization.

Production Example 4-2

Synthesis of Arm Portions (Polymer Chains) and Synthesis of Acid Decomposable Polymer Under a nitrogen atmosphere, 263.5 g of THF was cooled to −60° C. Under stirring, 30 ml of s-butyl lithium was added while maintaining at −60° C. and 42.4 g of PEES was added dropwise over 50 minutes, and then the reaction was continued for 1 hour.

At this stage, a small amount of the reaction solution was collected and the reaction was terminated by methanol. GPC measurement was conducted. As a result, the obtained PEES polymer is a monodisperse polymer having Mn=1,430 and Mw/Mn=1.13 (polystyrene equivalent values).

While maintaining the reaction system at −60° C., 6.6 g of dipentaerythritol-hexa(2-bromoethoxymethyl)ether obtained in Production Example 4-1 was added dropwise over 10 minutes and the reaction was continued for 1 hour.

The reaction was terminated by adding methanol to the reaction system and GPC measurement was conducted. As a result, the obtained acid decomposable polymer is a monodisperse polymer having Mn=3,620 and Mw/Mn=1.42 (polystyrene equivalent values).

In other words, it was confirmed that the polymer exhibits an increase in molecular weight after the reaction of dipentaerythritol-hexa(2-bromoethoxymethyl)ether while maintaining a monodisperse polymer before the reaction, and that the polymer is converted into a polymer having a star shape.

Production Example 4-3

Hydrolysis of PEES (Elimination of Protecting Group)

To the polymeric solution obtained in Production Example 4-2, MIBK was added and the organic layer was washed twice with ion-exchange water. The organic layer was subjected to a concentration operation under reduced pressure to prepare an MIBK solution containing 40% by weight of a polymer, and also a solution containing 20% by weight of a polymer was prepared by adding IPA.

To 100 parts by weight of this solution, 1 part by weight of oxalic acid dehydrate and 2 parts by weight of ion-exchange water were added, followed by heating to 50° C. Under stirring, the reaction was further continued for 8 hours while maintaining at 50° C.

In this reaction, $^{13}$C-NMR measurement was conducted before and after the reaction, and then the results were compared.

An absorption attributed to a PEES polymer observed at about 117 ppm disappeared after the reaction and an absorption attributed to a p-hydroxystyrene polymer was newly observed at about 115 ppm. Furthermore, it was confirmed that a peak attributed to an acetal bond (—O—CH$_2$—O—) observed at about 96 ppm is maintained before and after hydrolysis.

With respect to the polymer after the reaction, measurement was conducted by GPC. As a result, Mn was 2,000 (polystyrene equivalent value) and a large change in peak shape was not observed before and after the reaction.

As described above, it was confirmed that the hydrolysis reaction proceeded in an ethoxyethoxy group of PEES to obtain an alkenylphenol-type polymer containing a p-hydroxystyrene (hereinafter abbreviated to "PHS") segment as the main skeleton of arm portions. It was also confirmed that the O—CH$_2$—O bond introduced into the core portion of the polymer is maintained and the polymer maintains a star shape after the reaction.

Production Example 4-4

Introduction of Methyl Adamantyl Acetate Group

To the polymer solution obtained in Production Example 4-3, MIBK was added and the organic layer was washed three times with ion-exchange water. The organic layer was concentrated under reduced pressure to prepare a solution containing 50% by weight of a polymer and then a solution containing 10% by weight of a polymer was prepared by acetone.

To 50.0 g of the obtained polymer solution, 3.5 g of potassium carbonate was added, followed by maintaining at room temperature for 30 minutes under stirring. Then, 11.7 g of methyl adamantyl iodoacetate was added and the reaction was further continued at 35° C. for 8 hours.

To the reaction system, MIBK was added and the organic layer was washed once with an aqueous oxalic acid solution, then washed three times with ion-exchange water. The organic layer was replaced by a PGMEA solution through a concentration operation under reduced pressure.

With respect to the obtained polymer, measurement by $^{13}$C-NMR was conducted. As a result, absorptions attributed to units in which methyl adamantyl acetate groups are introduced into PHS (hereinafter referred to as PHS-OAdE) were newly observed at about 89 ppm, 114 ppm and 169 ppm.

The ratio of PHS units to PHS-OAdE was 80/20.

Further, it was confirmed that a peak at about 96 ppm attributed to an —O—CH$_2$—O-bond introduced into the core portion of the polymer is maintained.

With respect to the polymer after the reaction, GPC measurement was conducted. As a result, the polymer is a monodisperse polymer having Mn=4,200 and Mw/Mn=1.34. A change in peak shape of GPC was not observed before and after introducing methyl adamantyl acetate groups.

From the results shown above, it was confirmed that an alkenylphenol-type polymer containing a PHS/PHS-OAdE segment as the main skeleton of arm portions is obtained, and that an acetal bond introduced into the core portion of the polymer is maintained and this polymer maintains a star shape.

The structure of the polymer obtained in Production Example 4-4 above (hereinafter referred to as a polymer (A)-13) is shown below. In chemical formulas shown below, the subscript numerals on the lower right side of brackets indicate the percentage (mol %, composition ratio) of the respective structural units based on the combined total of all structural units constituting the polymer chain as arm portions of the polymer (A)-13 and each percentage was calculated by $^{13}$C-NMR.

With respect to the obtained polymer, measurement by $^{13}$C-NMR was conducted. As a result, absorptions attributed to units in which adamantyloxyethyl groups are introduced

[Chemical Formula 38]

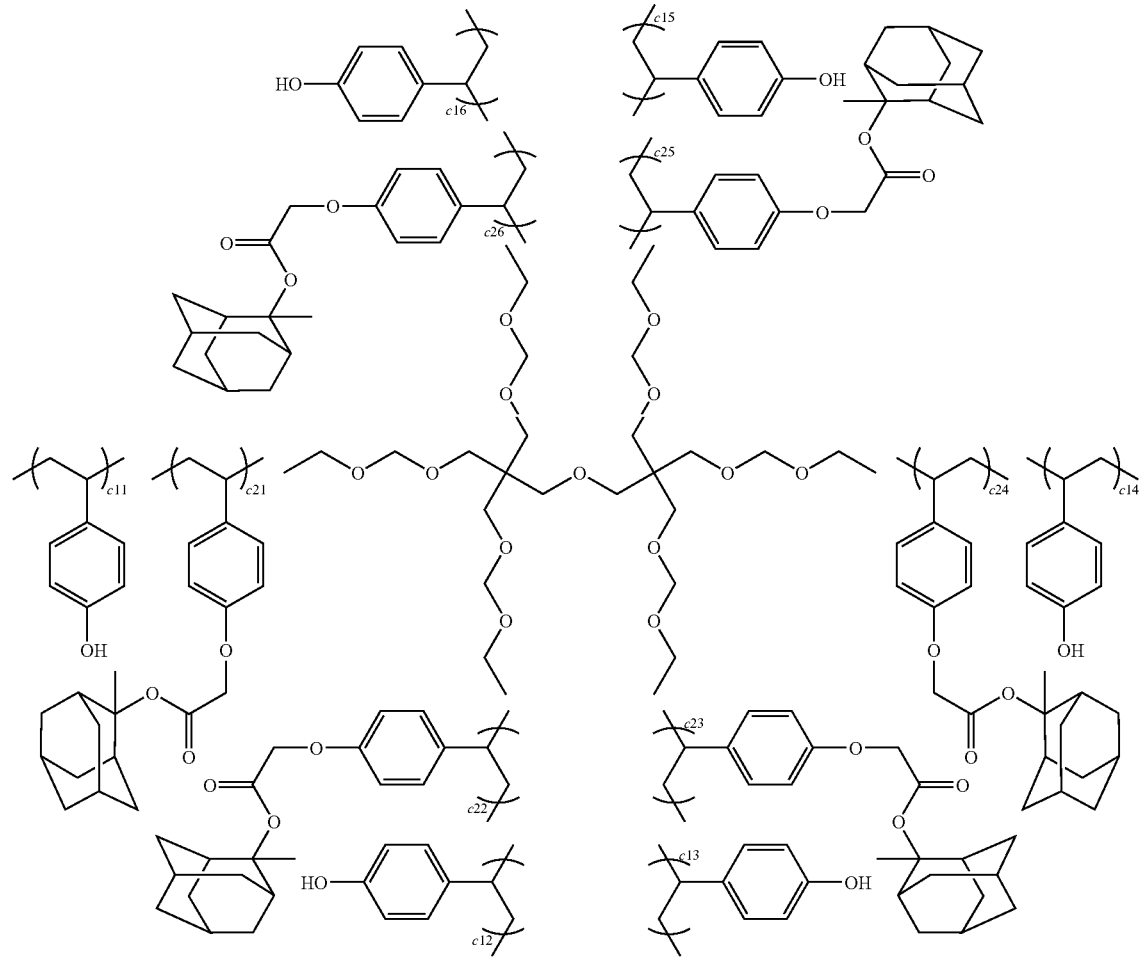

[(c11+c12+c13+c14+c15+c16)/(c21+c22+c23+c24+c25+c26)=80/20 (molar ratio); Mw=4,200, Mw/Mn=1.34]

Production Example 5

Production of Star Polymer (Polymer (A)-14

Production Example 5-1

Introduction of adamantyloxyethyl Group

To the polymer solution obtained in Production Example 1-3, MIBK was added and the organic layer was washed three times with ion-exchange water. The organic layer was concentrated under reduced pressure to prepare a PGMEA solution containing 30% by weight of a polymer.

To 50.0 g of the obtained polymer solution, 0.7 g of trifluoroacetic acid was added, followed by heating to 30° C. under stirring. Then, 9.4 g of adamantyl vinyl ether was added and the reaction was further continued at 30° C. for 3 hours.

After the reaction was terminated by adding triethylamine, MIBK was added to the reaction system and the organic layer was washed three times with ion-exchange water. Then, the organic layer was replaced by a PGMEA solution through a concentration operation under reduced pressure.

into PHS (hereinafter referred to as PHS-AdVE) were newly observed at about 94 ppm, 118 ppm and 156 ppm.

The ratio of a PHS unit to PHS-OAdE was 80/20.

Further, it was confirmed that a peak at about 96 ppm attributed to an —O—CH$_2$—O-bond introduced into the core portion of the polymer is maintained.

With respect to the polymer after the reaction, GPC measurement was conducted. As a result, the polymer is a monodisperse polymer having Mn=3,400 and Mw/Mn=1.22. A change in peak shape of GPC was not observed before and after introducing methyl adamantyl acetate groups.

From the results shown above, it was confirmed that an alkenylphenol-type polymer containing a PHS/PHS-AdVE segment as the main skeleton of arm portions is obtained, and that an acetal bond introduced into the core portion of the polymer is maintained and this polymer maintains a star shape.

The polymer obtained in Production Example 5-1 (hereinafter referred to as a polymer (A)-14) is shown below. In chemical formulas shown below, the subscript numerals on the lower right side of brackets indicate the percentage (mol %, composition ratio) of the respective structural units based on the combined total of all structural units constituting the polymer chain as arm portions of the polymer (A)-14 and each percentage was calculated by $^{13}$C-NMR.

[Chemical Formula 39]

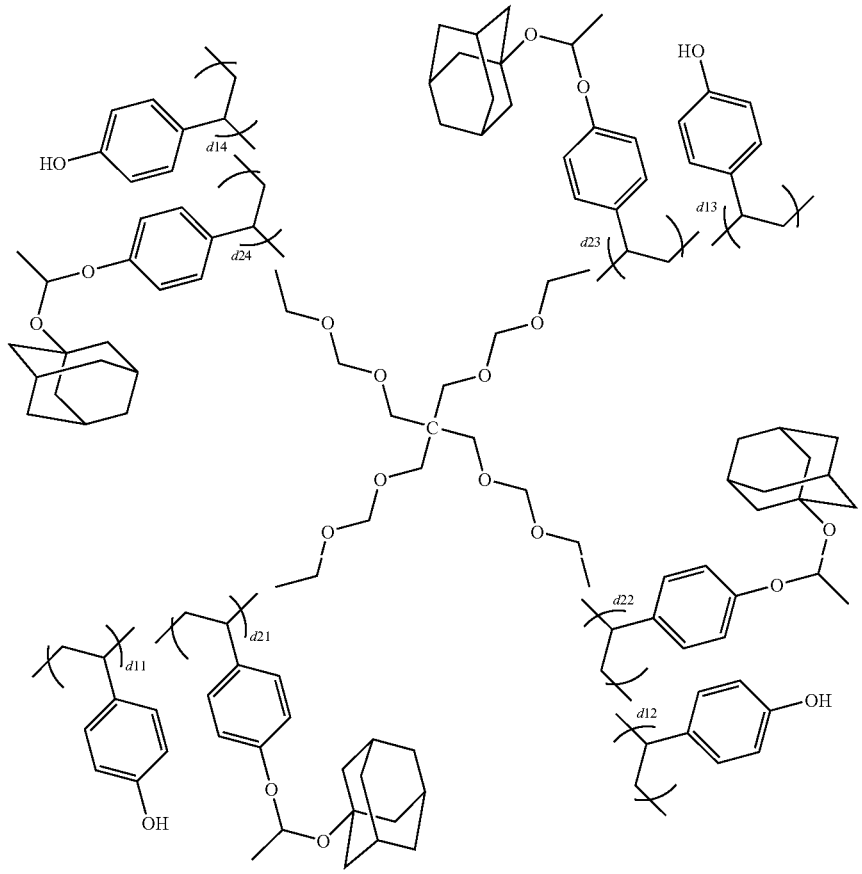

[(d11+d12+d13+d14)/(d21+d22+d23+d24)=80/20 (molar ratio); Mw=3,400, Mw/Mn=1.22]

Production Example 6

Production of Polymer (A)-12

5 g of poly-4-hydroxystyrene (Mn=2,900, Mw/Mn=1.06) was dissolved in 45 g of acetone and 3.5 g of potassium carbonate was added, followed by maintaining at room temperature for 30 minutes under stirring. Then, 3.5 g of methyl adamantyl iodoacetate was added and the reaction was further continued at 35° C. for 8 hours.

To the reaction system, MIBK was added and the organic layer was washed once with an aqueous oxalic acid solution, then washed three times with ion-exchange water. The organic layer was replaced by a PGMEA solution through a concentration operation under reduced pressure.

GPC measurement was conducted. As a result, the obtained polymer (A)-12 has Mn=4,300 and Mw/Mn=1.05 (polystyrene equivalent values). Further, composition ratio (molar ratio) was calculated by $^{13}$C-NMR.

Production Example 7

Production of Polymers (A)-15 to 20

In polymer (A)-13 as shown Chemical Formula 38, polymers (A)-15 to 20 which have such as different protection rate were obtained.

TABLE 7

| Name | molar ratio PHS/PHS-OAdE | Mn | Mw/Mn |
|---|---|---|---|
| polymer(A)-15 | 84/16 | 4180 | 1.13 |
| polymer(A)-16 | 74/26 | 4630 | 1.12 |
| polymer(A)-17 | 64/36 | 5180 | 1.06 |
| polymer(A)-18 | 84/16 | 3440 | 1.10 |
| polymer(A)-19 | 75/25 | 3950 | 1.09 |
| polymer(A)-20 | 65/35 | 4300 | 1.09 |

In Table 7, "molar ratio PHS/PHS-OAdE" is the composition ratio (molar ratio) of each structural unit based on PHS/PHS-OAdE segment as the main skeleton of arm portions. The value of "PHS" of the molar ratio is (c11+c12+c13+c14+c15+c16) in Chemical formula 38, and the value of "PHS-OAdE" of the molar ratio is (c21+c22+c23+c24+c25+c26) in Chemical formula 38. The value of "Mn", "Mw/Mn" is the polystyrene equivalent value in Table 7, Table 7a, and Table 7b.

Production Examples 7-1 to 7-2

Synthesis of Arm Portions (Polymer Chains) and Synthesis of Acid Decomposable Polymer In the same manner as in Production Example 4-2, except that the amount of PEES added dropwise was changed as shown in Table 7a, and that moisture incorporation in the reaction was reduced by a glove box, acid decomposable polymers, each having a different molecular weight of the polymer chain shown in Table 7a were obtained.

TABLE 7a

|  | Amount of PEES added dropwise | Amount of polymer (PEES) Mn | Polymer chain (PEES) Mw/Mn | Acid Decomposable polymer Mn | Acid Decomposable polymer Mw/Mn |
|---|---|---|---|---|---|
| Production Example 7-1 | 42.4 g | 1460 | 1.15 | 4800 | 1.19 |
| Production Example 7-2 | 29.0 g | 960 | 1.38 | 4000 | 1.20 |

Production Examples 7-3 to 7-4

Hydrolysis of PEES (Elimination of Protecting Group)

In the same manner as in Production Example 4-3, except that the polymeric solution obtained in Production Example 7-1 or Production Example 7-2 was used in place of the polymeric solution obtained in Production Example 4-2, star polymers containing a PHS segment shown in Table 7b as the main skeleton of arm portions were obtained.

TABLE 7b

|  | Polymeric solution | Star polymer Mn | Star polymer Mw/Mn |
|---|---|---|---|
| Production Example 7-3 | Production Example 7-1 | 2900 | 1.12 |
| Production Example 7-4 | Production Example 7-2 | 2070 | 1.37 |

Production Examples 7-5 to 7-10

Introduction of Methyl Adamantyl Acetate Group

In the same manner as in Production Example 4-4, except that the polymeric solution obtained in Production Example 7-3 or Production Example 7-4 was used in place of the polymeric solution obtained in Production Example 4-3, and that the amount of methyl adamantyl iodoacetate added dropwise was changed as shown in Table 7c, alkenylphenol-type polymers containing a PHS/PHS-OAdE segment shown in Table 7 as the main skeleton of arm portions is obtained TABLE 7c

|  | Polymer | Methyl adamantyl iodoacetate | Name |
|---|---|---|---|
| Production Example 7-5 | Production Example 7-3 | 1.8 g | (A)-15 |
| Production Example 7-6 |  | 3.0 g | (A)-16 |
| Production Example 7-7 |  | 4.2 g | (A)-17 |
| Production Example 7-8 | Production Example 7-4 | 1.7 g | (A)-18 |
| Production Example 7-9 |  | 2.8 g | (A)-19 |

TABLE 7c-continued

|  | Polymer | Methyl adamantyl iodoacetate | Name |
|---|---|---|---|
| Production Example 7-10 |  | 3.9 g | (A)-20 |

Preparation-1 of Resist Composition

Example 1, Comparative Example 1

The respective components shown in Table 8 were mixed and dissolved to prepare a positive resist composition.

TABLE 8

|  | Component (A) | Component (B) | Component (D) | Component (E) | Component (S) |
|---|---|---|---|---|---|
| Example 1 | (A)-1 [100] | (B)-1 [12.6] | (D)-1 [0.38] | (E)-1 [0.15] | (S)-1 [3,900] |
| Comparative Example 1 | (A)-2 [100] | (B)-1 [12.6] | (D)-1 [0.38] | (E)-1 [0.15] | (S)-1 [3,900] |

Abbreviations in Table 8 have the following meanings. Numerical values in brackets are parts by weight.
(A)-1: polymer (A)-1 shown above
(A)-2: polymer (A)-2 shown above
(B)-1: triphenylsulfoniumnonafluoro-n-butane sulfonate.
(D)-1: tri-n-octylamine
(E)-1: salicylic acid
(S)-1: PGMEA
Formation-1 of Resist Pattern
[Sensitivity and Resolution]
Using the obtained positive resist composition, resolution was evaluated.
A positive resist composition of each example was uniformly applied onto an 8 inch silicone substrate subjected to a hexamethyldisilazane (HMDS) treatment at 90° C. for 36 seconds using a spinner, and a prebake (PAB) was conducted at a temperature shown in Table 8 for 60 seconds to form a resist film (film thickness: 80 nm).
Using an electron beam lithography system HL-800D (VSB) (manufactured by Hitachi, Ltd.), the resist film was irradiated (exposure) at an acceleration voltage of 70 kV, followed by post exposure bake (PEB) at a temperature shown in Table 8 for 60 seconds. Subsequently, developing was conducted using a 2.38% by weight aqueous solution of tetramethylammonium hydroxide (TMAH) (product name: NMD-3, manufactured by TOKYO OHKA KOGYO CO., LTD.) at 23° C. for 30 seconds, followed by rinsing with pure water for 15 seconds to form a line and space (L/S) pattern.
At this time, the exposure dose (Eop; $\mu C/cm^2$) for forming a L/S (1:1) pattern having a line width of 100 nm was determined. The results are shown in Table 8.
Threshold resolution (nm) in the Eop above was determined by using a scanning electron microscope S-9220 (manufactured by Hitachi, Ltd.). The results are shown as "resolution (nm)" in Table 9.

TABLE 9

|  | PAB (° C.) | PEB (° C.) | Eop ($\mu C/cm^2$) | Resolution (nm) |
|---|---|---|---|---|
| Example 1 | 110 | 100 | 44.0 | 60 |
| Comparative Example 1 | 110 | 100 | 24.0 | 70 |

From the results shown in Table 9, it could be confirmed that the positive resist composition of Example 1 according to the present invention is excellent in resolution when compared with the positive resist composition of Comparative Example 1.

Also, it could be confirmed that the resist pattern formed by using the positive resist composition of Example 1 has a satisfactory shape with reduced roughness.

Preparation-2 of Resist Composition

Examples 2 to 10, Comparative Example 2

The respective components shown in Table 10 were mixed and dissolved to prepare positive resist compositions.

TABLE 10

|  | Component (A) | Component (B) | Component (D) | Component (E) | Component (S) |
|---|---|---|---|---|---|
| Example 2 | (A)-3 [100] | (B)-2 [37.5] | (D)-1 [1.8] | (E)-1 [0.72] | (S)-2 [3,900] |
| Example 3 | (A)-4 [100] | (B)-2 [37.5] | (D)-1 [1.8] | (E)-1 [0.72] | (S)-2 [3,900] |
| Example 4 | (A)-5 [100] | (B)-2 [37.5] | (D)-1 [1.8] | (E)-1 [0.72] | (S)-2 [3,900] |
| Example 5 | (A)-6 [100] | (B)-2 [37.5] | (D)-1 [1.8] | (E)-1 [0.72] | (S)-2 [3,900] |
| Example 6 | (A)-7 [100] | (B)-2 [37.5] | (D)-1 [1.8] | (E)-1 [0.72] | (S)-2 [3,900] |
| Example 7 | (A)-8 [100] | (B)-2 [37.5] | (D)-1 [1.8] | (E)-1 [0.72] | (S)-2 [3,900] |
| Example 8 | (A)-9 [100] | (B)-2 [37.5] | (D)-1 [1.8] | (E)-1 [0.72] | (S)-2 [3,900] |
| Example 9 | (A)-10 [100] | (B)-2 [37.5] | (D)-1 [1.8] | (E)-1 [0.72] | (S)-2 [3,900] |
| Example 10 | (A)-11 [100] | (B)-2 [37.5] | (D)-1 [1.8] | (E)-1 [0.72] | (S)-2 [3,900] |
| Comparative Example 2 | (A)-12 [100] | (B)-2 [37.5] | (D)-1 [1.8] | (E)-1 [0.72] | (S)-2 [3,900] |

Among abbreviations in Table 10, (D)-1 and (E)-1 are as follows. Others have the following meanings. Numerical values in brackets are parts by weight.

(A)-3: polymer (A)-3 shown above (A)-4: polymer (A)-4 shown above (A)-5: polymer (A)-5 shown above (A)-6: polymer (A)-6 shown above (A)-7: polymer (A)-7 shown above (A)-8: polymer (A)-8 shown above (A)-9: polymer (A)-9 shown above (A)-10: polymer (A)-10 shown above (A)-11: polymer (A)-11 shown above (A)-12: polymer (A)-12 shown above (compound represented by chemical formula (A)-12 shown below)

(B)-2: compound represented by chemical formula (B)-2 shown below (S)-2: mixed solvent of PGMEA/PGME=6/4 (weight ratio)

[Chemical Formula 40]

(A)-12

[The subscript numerals on the lower right side of brackets indicate the percentage (mol %) of the respective structural units.]

[Chemical Formula 41]

(B)-2

Formation-2 of Resist Pattern [Sensitivity]

In the same manner as in Formation-1 of resist pattern shown above, except that the obtained positive resist composition was used and the PAB temperature and the PEB temperature were changed as shown in Table 10 a 1:1 L/S pattern having a line width of 100 nm was formed.

At this time, the exposure dose (Eop; $\mu C/cm^2$) was determined. The results are shown in Table 10.

[Evaluation of LWR (Line Width Roughness)]

With respect to the 1:1 L/S pattern having a line width of 100 nm formed with the above-mentioned Eop, 5 points in the lengthwise direction of the line were measured using a measuring SEM (product name: S-9220, manufactured by Hitachi, Ltd.), and from the results, the value of 3 times the standard deviation s (3s) was calculated as a yardstick of LWR. The results are shown in Table 2. The smaller this 3s value is, the lower the level of roughness of the line width, indicating that a resist pattern with a uniform width was obtained. The results are shown in Table 11.

TABLE 11

|  | PAB (° C.) | PEB (° C.) | Eop ($\mu C/cm^2$) | LWR (nm) |
|---|---|---|---|---|
| Example 2 | 100 | 80 | 42 | 15.5 |
| Example 3 | 100 | 80 | 44 | 12.3 |
| Example 4 | 100 | 80 | 42 | 14.6 |
| Example 5 | 100 | 80 | 52 | 18.6 |

TABLE 11-continued

| | PAB (°C.) | PEB (°C.) | Eop (µC/cm²) | LWR (nm) |
|---|---|---|---|---|
| Example 6 | 100 | 80 | 54 | 14.0 |
| Example 7 | 100 | 80 | 48 | 16.7 |
| Example 8 | 100 | 80 | 50 | 15.2 |
| Example 9 | 100 | 80 | 54 | 19.0 |
| Example 10 | 80 | 80 | 44 | 18.5 |
| Comparative Example 2 | 100 | 80 | 58 | 20.0 |

From the results shown in Table 11, it could be confirmed that the positive resist compositions of Examples 2 to 10 according to the present invention are excellent in LWR when compared with the positive resist composition of Comparative Example 2.

Preparation-3 of Resist Composition (Examples 11 to 13, Comparative Example 3)

The respective components shown in Table 12 were mixed and dissolved to prepare positive resist compositions.

TABLE 12

| | Component (A) | Component (B) | Component (D) | Component (E) | Component (S) |
|---|---|---|---|---|---|
| Example 11 | (A)-6 [100] | (B)-3 [37.5] | (D)-1 [1.8] | (E)-1 [0.72] | (S)-2 [3900] |
| Example 12 | (A)-7 [100] | (B)-3 [37.5] | (D)-1 [1.8] | (E)-1 [0.72] | (S)-2 [3900] |
| Example 13 | (A)-8 [100] | (B)-3 [37.5] | (D)-1 [1.8] | (E)-1 [0.72] | (S)-2 [3900] |
| Comparative Example 3 | (A)-12 [100] | (B)-3 [37.5] | (D)-1 [1.8] | (E)-1 [0.72] | (S)-2 [3900] |

Among abbreviations in Table 12, (A)-6, (A)-7, (A)-8, (A)-12, (D)-1, (E)-1 and (S)-2 are as shown above. (B)-3 indicates a compound represented by chemical formula (B)-3 shown below. Numerical values in brackets are parts by weight.

[Chemical Formula 42]

(B)-3

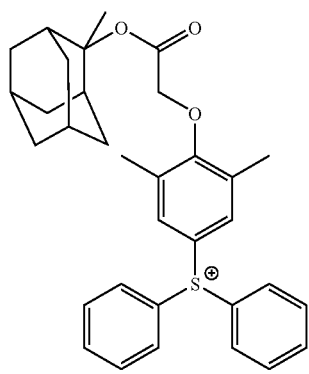

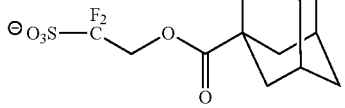

Formation-3 of Resist Pattern

[Sensitivity, LWR, Threshold Resolution]

In the same manner as in Formation-1 of resist pattern shown above, except that the obtained positive resist composition was used and the PAB temperature and the PEB temperature were changed as shown in Table 12, a resist pattern was formed. In any case, a 1:1 L/S pattern having a line width of 100 nm was formed. At this time, the exposure dose (Eop; µC/cm²) was determined.

LWR was also evaluated in the same manner as in Example 2.

Further, threshold resolution in the Eop above was determined in the same manner as in Example 1. The results are shown in Table 13.

TABLE 13

| | PAB (°C.) | PEB (°C.) | Eop (µC/cm²) | LWR (nm) | Threshold resolution (nm) |
|---|---|---|---|---|---|
| Example 11 | 100 | 80 | 58 | 12.5 | 50 |
| Example 12 | 100 | 80 | 62 | 11.9 | 50 |
| Example 13 | 100 | 80 | 58 | 10.7 | 50 |
| Comparative Example 3 | 100 | 80 | 68 | 16.3 | 60 |

From the results shown in Table 13, it could be confirmed that the positive resist compositions of Examples 11 to 13 according to the present invention are excellent in LWR when compared with the positive resist composition of Comparative Example 3.

It could also be confirmed that the positive resist compositions of Examples 11 to 13 are excellent in resolution and sensitivity when compared with the positive resist composition of Comparative Example 3.

Preparation-4 of Resist Composition (Examples 14 to 16)

The respective components shown in Table 14 were mixed and dissolved to prepare positive resist compositions.

TABLE 14

| | Component (A) | Component (B) | Component (D) | Component (E) | Component (S) |
|---|---|---|---|---|---|
| Example 14 | (A)-7 [100] | (B)-2 [23] | (D)-1 [1.5] | — | (S)-2 [3900] |
| Example 15 | (A)-13 [100] | (B)-2 [23] | (D)-1 [1.5] | — | (S)-2 [3900] |
| Example 16 | (A)-13 [100] | (B)-3 [37.5] | (D)-1 [1.8] | (E)-1 [0.72] | (S)-2 [3900] |

Among abbreviations in Table 14, (A)-7, (B)-2, (B)-3, (D)-1, (E)-1 and (S)-2 are as shown above. (A)-13 indicates the polymer (A)-13 shown above. Numerical values in brackets are parts by weight.

Formation-4 of Resist Pattern

[Sensitivity, LWR, Threshold Resolution]

In the same manner as in Formation-1 of resist pattern shown above, except that the obtained positive resist composition was used and the PAB temperature and the PEB temperature were changed as shown in Table 14, a resist pattern was formed. In any case, a 1:1 L/S pattern having a line width of 100 nm was formed. At this time, the exposure dose (Eop; μC/cm$^2$) was determined.

LWR was also evaluated in the same manner as in Example 2.

Further, threshold resolution in the Eop above was determined in the same manner as in Example 1. The results are shown in Table 15.

TABLE 15

| | PAB (° C.) | PEB (° C.) | Eop (μC/cm$^2$) | LWR (nm) | Threshold resolution (nm) |
|---|---|---|---|---|---|
| Example 14 | 80 | 80 | 42 | 15.6 | 50 |
| Example 15 | 80 | 80 | 42 | 14.0 | 50 |
| Example 16 | 80 | 80 | 64 | 13.0 | 50 |

From the results shown in Table 15, it could be confirmed that the positive resist compositions of Examples 14 to 16 according to the present invention are excellent in both LWR and resolution.

Preparation-5 of Resist Composition (Examples 17 to 18)

The respective components shown in Table 16 were mixed and dissolved to prepare positive resist compositions.

TABLE 16

| | Component (A) | Component (B) | Component (D) | Component (E) | Component (S) |
|---|---|---|---|---|---|
| Example 17 | (A)-14 [100] | (B)-2 [23] | (D)-1 [1.5] | — | (S)-2 [3900] |
| Example 18 | (A)-14 [100] | (B)-3 [37.5] | (D)-1 [1.5] | (E)-1 [0.56] | (S)-2 [3900] |

Among abbreviations in Table 16, (A)-14 is the polymer (A)-14 above, and (B)-2, (B)-3, (D)-1, (E)-1 and (S)-2 are as shown above. Numerical values in brackets are parts by weight.

Formation-5 of Resist Pattern

[Sensitivity, LWR, Threshold Resolution]

In the same manner as in Formation-1 of resist pattern shown above, except that the obtained positive resist composition was used and the PAB temperature and the PEB temperature were changed as shown in Table 16, a resist pattern was formed. In any case, a 1:1 L/S pattern having a line width of 100 nm was formed. At this time, the exposure dose (Eop; μC/cm$^2$) was determined.

LWR was also evaluated in the same manner as in Example 1.

Further, threshold resolution in the Eop above was determined in the same manner as in Example 2. The results are shown in Table 17.

TABLE 17

| | PAB (° C.) | PEB (° C.) | Eop (μC/cm$^2$) | LWR (nm) | Threshold resolution (nm) |
|---|---|---|---|---|---|
| Example 17 | 80 | 80 | 20 | 19.0 | 50 |
| Example 18 | 80 | 80 | 40 | 14.5 | 60 |

From the results shown in Table 17, it could be confirmed that the positive resist compositions of Examples 17 to 18 according to the present invention are excellent in both LWR and resolution.

Preparation-6 of Resist Composition (Examples 19 to 24)

The respective components shown in Table 18 were mixed and dissolved to prepare positive resist compositions.

TABLE 18

| | Component (A) | Component (B) | Component (D) | Component (E) | Component (S) |
|---|---|---|---|---|---|
| Example 19 | (A)-15 [100] | (B)-3 [37.5] | (D)-1 [1.4] | (E)-1 [0.56] | (S)-2 [3900] |
| Example 20 | (A)-16 [100] | (B)-3 [37.5] | (D)-1 [1.4] | (E)-1 [0.56] | (S)-2 [3900] |
| Example 21 | (A)-17 [100] | (B)-3 [37.5] | (D)-1 [1.4] | (E)-1 [0.56] | (S)-2 [3900] |
| Example 22 | (A)-18 [100] | (B)-3 [37.5] | (D)-1 [1.4] | (E)-1 [0.56] | (S)-2 [3900] |
| Example 23 | (A)-19 [100] | (B)-3 [37.5] | (D)-1 [1.4] | (E)-1 [0.56] | (S)-2 [3900] |
| Example 24 | (A)-20 [100] | (B)-3 [37.5] | (D)-1 [1.4] | (E)-1 [0.56] | (S)-2 [3900] |

Among abbreviations in Table 18, (A)-15 to 20 are the polymer (A)-15 to 20 above, and (B)-3, (D)-1, (E)-1 and (S)-2 are as shown above. Numerical values in brackets are parts by weight.

Formation-6 of Resist Pattern

[Sensitivity, LWR, Threshold Resolution]

Using the obtained positive resist composition, resolution was evaluated.

A positive resist composition of each example was uniformly applied onto an 8 inch silicone substrate subjected to a hexamethyldisilazane (HMDS) treatment at 90° C. for 36 seconds using a spinner, and a prebake (PAB) was conducted at 90° C. for 60 seconds to form a resist film (film thickness: 50 nm).

Using an electron beam lithography system HL-800D (VSB) (manufactured by Hitachi, Ltd.), the resist film was irradiated (exposure) at an acceleration voltage of 70 kV, followed by post exposure bake (PEB) at 80° C. for 60 seconds. Subsequently, developing was conducted using a 2.38% by weight aqueous solution of tetramethylammonium hydroxide (TMAH) (product name: NMD-3, manufactured by TOKYO OHKA KOGYO CO., LTD.) at 23° C. for 60 seconds, followed by rinsing with pure water for 15 seconds to form a line and space (L/S) pattern. In any case, a 1:1 L/S pattern having a line width of 100 nm was formed. The exposure dose (Eop; μC/cm$^2$), LWR and threshold resolution were determined. The results are shown in Table 19.

TABLE 19

|  | Eop (μC/cm²) | LWR (nm) | Threshold resolution (nm) |
|---|---|---|---|
| Example 19 | 50 | 14.7 | 50 |
| Example 20 | 48 | 12.5 | 50 |
| Example 21 | 38 | 12.0 | 50 |
| Example 22 | 38 | 12.7 | 50 |
| Example 23 | 36 | 10.8 | 50 |
| Example 24 | 34 | 10.4 | 50 |

From the results shown in Table 19, it could be confirmed that the positive resist compositions of Examples 19 to 24 according to the present invention are excellent in both LWR and resolution.

What is claimed is:

1. A positive resist composition comprising a resin component (A) which exhibits increased solubility in an alkali developing solution under action of acid, and an acid-generator component (B) which generates acid upon irradiation, said resin component (A) containing a polymer comprising:
a core portion represented by formula (1) shown below; and
arm portions that are bonded to the core portion and are also composed of a polymer chain obtained by an anionic polymerization method, wherein said arm portions have a structural unit derived from a hydroxystyrene derivative,

$$P+X-Y)_a \quad (1)$$

wherein P represents an a-valent organic group; a represents an integer of 3 to 20; Y represents an arylene group or an alkylene group of 1 to 12 carbon atoms; and X represents any one of the linking groups represented by formulas (2) to (5) shown below which can be cleaved under action of acid,

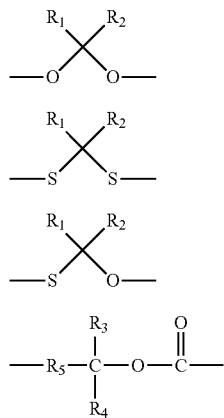

wherein $R_1$ and $R_2$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, alkoxy group or a hydrogen atom; $R_3$ and $R_4$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, or an alkoxy group; and $R_5$ represents a linear, branched or cyclic alkylene group of 1 to 12 carbon atoms which may be substituted with alkoxy group, hydroxyl group, a halogen atom or an epoxy group, an arylene group which may be substituted with alkoxy group, hydroxyl group, a halogen atom or an epoxy group, or a single bond.

2. The positive resist composition according to claim 1, wherein said arm portions have a structural unit containing an acid dissociable, dissolution inhibiting group.

3. The positive resist composition according to claim 2, wherein said acid dissociable, dissolution inhibiting group contains a group represented by formula (p0) or formula (p1-1) shown below:

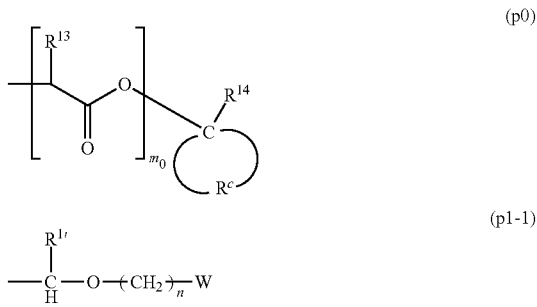

wherein $m_0$ represents 0 or 1; $R^{13}$ represents a hydrogen atom or a methyl group; $R^{14}$ represents an alkyl group; and $R^c$ is bonded with the carbon atom (C) to form an aliphatic cyclic group; $R^{1'}$ represents a hydrogen atom or a lower alkyl group of 1 to 5 carbon atoms; n represents an integer of 0 to 3; and W represents an aliphatic cyclic group or a lower alkyl group of 1 to 5 carbon atoms.

4. The positive resist composition according to claim 1, which further comprises a nitrogen-containing organic compound component (D).

5. A method of forming a resist pattern, comprising: forming a resist film on a substrate using the positive resist composition of claim 1; conducting exposure of said resist film; and alkali-developing said resist film to form a resist pattern.

6. A positive resist composition comprising a resin component (A) which exhibits increased solubility in an alkali developing solution under action of acid, and an acid-generator component (B) which generates acid upon irradiation, said resin component (A) containing a polymer comprising:
a core portion represented by formula (1) shown below; and
arm portions that are bonded to the core portion and are also composed of a polymer chain obtained by an anionic polymerization method, wherein said arm portions have a structural unit derived from a hydroxystyrene derivative,

$$P+X-Y)_a \quad (1)$$

wherein P represents an a-valent organic group; a represents an integer of 3 to 20; Y represents an arylene group or an alkylene group of 1 to 12 carbon atoms; and X represents any one of the linking groups represented by formulas (2) to (5) shown below which can be cleaved under action of acid,

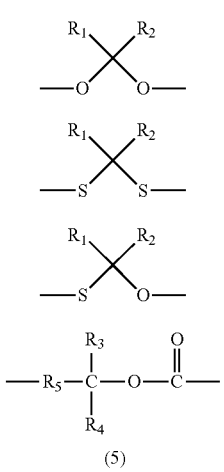

(2)

(3)

(4)

(5)

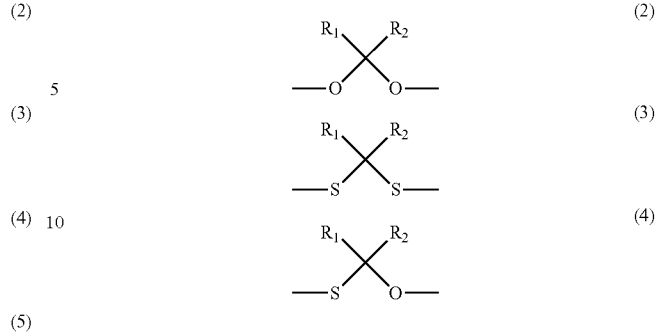

wherein $R_1$ and $R_2$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, alkoxy group or a hydrogen atom; $R_3$ and $R_4$ each independently represents a linear, branched or cyclic alkyl group of 1 to 12 carbon atoms which may be substituted with alkoxy group, hydroxyl group, a halogen atom or an epoxy group; and $R_5$ represents a linear, branched or cyclic alkylene group of 1 to 12 carbon atoms which may be substituted with alkoxy group, hydroxyl group, a halogen atom or an epoxy group, an arylene group which may be substituted with alkoxy group, hydroxyl group, a halogen atom or an epoxy group, or a single bond.

7. A positive resist composition comprising a resin component (A) which exhibits increased solubility in an alkali developing solution under action of acid, and an acid-generator component (B) which generates acid upon irradiation, said resin component (A) containing a polymer comprising:

a core portion represented by formula (1) shown below; and arm portions that are bonded to the core portion and are also composed of a polymer chain obtained by an anionic polymerization method,

   (1)

wherein P represents an a-valent organic group; a represents an integer of 3 to 20; Y represents an arylene group or an alkylene group of 1 to 12 carbon atoms; and X represents any one of the linking groups represented by formulas (2) to (4) shown below which can be cleaved under action of acid, wherein $R_1$ and $R_2$ each independently represents a linear, branched or cyclic alkyl group of 1 to 12 carbon atoms which may be substituted with alkoxy group, hydroxyl group, a halogen atom or an epoxy group, an aryl group which may be substituted with alkoxy group, hydroxyl group, a halogen atom or an epoxy group, alkoxy group or a hydrogen atom.

8. The positive resist composition according to claim 7, wherein said arm portions have a structural unit derived from a hydroxystyrene derivative.

9. The positive resist composition according to claim 7, wherein said arm portions have a structural unit containing an acid dissociable, dissolution inhibiting group.

10. The positive resist composition according to claim 9, wherein said acid dissociable, dissolution inhibiting group contains a group represented by formula (p0) or formula (p1-1) shown below:

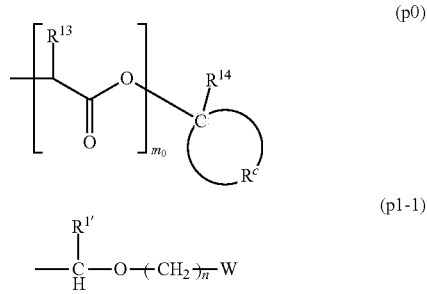

wherein $m_0$ represents 0 or 1; $R^{13}$ represents a hydrogen atom or a methyl group; $R^{14}$ represents an alkyl group; and $R^c$ is bonded with the carbon atom (C) to form an aliphatic cyclic group; $R^{1\prime}$ represents a hydrogen atom or a lower alkyl group of 1 to 5 carbon atoms; n represents an integer of 0 to 3; and W represents an aliphatic cyclic group or a lower alkyl group of 1 to 5 carbon atoms.

11. The positive resist composition according to claim 7, which further comprises a nitrogen-containing organic compound component (D).

12. A method of forming a resist pattern, comprising: forming a resist film on a substrate using the positive resist composition of claim 7; conducting exposure of said resist film; and alkali-developing said resist film to form a resist pattern.

* * * * *